(12) United States Patent
Kitagawa et al.

(10) Patent No.: US 8,094,491 B2
(45) Date of Patent: Jan. 10, 2012

(54) SEMICONDUCTOR DEVICE

(75) Inventors: Makoto Kitagawa, Kanagawa (JP);
Mitsuo Soneda, Kanagawa (JP)

(73) Assignee: Sony Corporation, Tokyo (JP)

( * ) Notice: Subject to any disclaimer, the term of this patent is extended or adjusted under 35 U.S.C. 154(b) by 485 days.

(21) Appl. No.: 12/230,283

(22) Filed: Aug. 27, 2008

(65) Prior Publication Data
US 2009/0086536 A1  Apr. 2, 2009

(30) Foreign Application Priority Data
Sep. 28, 2007  (JP) .................... 2007-256366

(51) Int. Cl.
*G11C 11/39* (2006.01)
(52) U.S. Cl. ....................... 365/180; 365/103
(58) Field of Classification Search .......... 365/103, 365/180, 175, 181; 257/133, 146
See application file for complete search history.

(56) References Cited

U.S. PATENT DOCUMENTS

| 6,611,452 | B1 * | 8/2003 | Han ................... 365/159 |
| 6,781,888 | B1 * | 8/2004 | Horch et al. .......... 365/189.09 |
| 6,944,051 | B1 * | 9/2005 | Lee et al. ............. 365/159 |
| 7,245,525 | B1 * | 7/2007 | Lee et al. ............. 365/159 |
| 2002/0089024 | A1 * | 7/2002 | Iwata ................. 257/421 |
| 2007/0096203 | A1 * | 5/2007 | Mouli ................. 257/330 |
| 2008/0242009 | A1 * | 10/2008 | Cho ................... 438/135 |
| 2009/0296463 | A1 * | 12/2009 | Cho ................... 365/174 |

FOREIGN PATENT DOCUMENTS

| JP | 2002-246560 | 8/2002 |
| JP | 2007-049113 | 2/2007 |
| JP | 2007-067133 | 3/2007 |

OTHER PUBLICATIONS

F. Nemati et al., "A Novel Thyristor-based SRAM Cell (T-RAM) for High-Speed, Low-Voltage, Giga-scale Memories", Technical Digest IEDM 1999, pp. 283-286, Stanford, CA.
R. Roy et al., "Thyristor-based Volatile Memory in Nano-scale CMOS", 2006 IEEE International Solid-State Circuits Conference, pp. 632-633, Session 34, San Jose, CA.

* cited by examiner

*Primary Examiner* — Anh Phung
*Assistant Examiner* — Douglas King
(74) *Attorney, Agent, or Firm* — Rader, Fishman & Grauer PLLC

(57) ABSTRACT

A semiconductor device includes a memory cell including a thyristor element with a gate having a pnpn structure formed in a semiconductor substrate, and a plurality of access transistors formed on the semiconductor substrate and each connected at a first terminal thereof to a storage node at one terminal of the thyristor element such that a potential at the storage node can be transmitted to bit lines different from each other, the gate of the thyristor element and the gates of the plurality of access transistors of the memory cell being connected to word lines different from one another.

7 Claims, 33 Drawing Sheets

[STANDBY]

[STANDBY]

[READING OUT]

[READING OUT]

[WRITING OF DATA 1]

[WRITING OF DATA 1]

[WRITING OF DATA 0]

[WRITING OF DATA 0]

[READ DISTURB]

[READ DISTURB]

SEMICONDUCTOR DEVICE

CROSS REFERENCES TO RELATED APPLICATIONS

The present invention contains subject matter related to Japanese Patent Application JP 2007-256366 filed with the Japan Patent Office on Sep. 28, 2007, the entire contents of which being incorporated herein by reference.

BACKGROUND OF THE INVENTION

1. Field of the Invention

This invention relates to a semiconductor device wherein a memory cell or memory element is formed from an access transistor and a thyristor element.

2. Description of the Related Art

Various forms have been proposed for a memory cell or thyristor RAM cell formed from a thyristor element and an access transistor and are disclosed, for example, in Japanese Patent Laid-Open Nos. 2007-49113 (hereinafter referred to as Patent Document 1), 2007-67133 (hereinafter referred to as Patent Document 2) and 2002-246560 (hereinafter referred to as Patent Document 3), Rich Roy, Farid Nemati, Ken Young, Bruce Bateman, Rajesh Chopra, Seong-Ook Jung, Chiming Show, and Hyun-Jin Cho, 2006 IEEE International Solid-State Circuits Conference, pp. 632-633 (hereinafter referred to as Non-Patent Document 1), and Farid Nemati and James D. Plummer, Technical Digest IEDM 199, pp. 283-286 (hereinafter referred to as Non-Patent Document 2).

One of such memory cells as mentioned above is a memory device which includes a thyristor element and an access transistor formed on a bulk-type semiconductor substrate.

FIG. 1 is a simplified schematic cross sectional view showing an example of a configuration of a memory cell including a thyristor element and an access transistor formed on a bulk-type semiconductor substrate. The thyristor element of the memory cell is of the selective epitaxy anode (SEA) type.

Meanwhile, FIG. 2 is an equivalent circuit diagram of the memory cell of FIG. 1.

Referring to FIGS. 1 and 2, the memory element 1 shown includes a thyristor element 3 and an access transistor 4 formed in parallel to each other across an element isolation region 5 on a bulk-type semiconductor substrate 2 of the p-type.

The thyristor element 3 has a pnpn thyristor structure wherein a p-type anode 32, an n-type anode 33, a p-type base 34 and an n-type cathode 35 are formed on an n-type well 31.

A gate electrode 37 is formed on the p-type base 34 with a gate insulating film 36 interposed therebetween.

The thyristor element 3 has a combination of bipolar transistors of the npn type and the pnp type, which have a common base and a common collector. Further, the gate electrode 37 of the MIS type is formed on the base of the npn type.

The access transistor 4 includes n-type diffusion layers 42 and 43 formed in a p-type well 41, and a gate electrode 45 formed on the p-type well 41 sandwiched between the diffusion layers 42 and 43 with a gate insulating film 44 interposed therebetween.

The p-type anode 32 of the thyristor element 3 is connected to a supply line LVREF of a reference voltage Vref, and the diffusion layer 42 of the access transistor 4 is connected to a bit line BL while the n-type cathode 35 of the thyristor element 3 and the diffusion layer 43 of the access transistor 4 are connected to each other by a storage node VSN.

The gate electrode 37 of the thyristor element 3 is connected to a word line TWL, and the gate electrode 45 of the access transistor 4 is connected to another word line SWL.

The thyristor element having such a configuration as described above has a negative resistance characteristic and has two stable points. The two stable points are read as 0 and 1 of data.

In the following, the voltage or potential state of a thyristor RAM cell upon operation is described.

FIGS. 3A and 3B illustrate a potential state when the thyristor RAM cell retains data.

When the thyristor RAM cell retains data, the word lines SWL and TWL are set to 0 V, that is, to an off state, and also the bit line is set to 0 V as seen in FIG. 3A.

At this time, as seen in FIG. 3B, a stable point at which thyristor current It and access transistor current Ia balance with each other is given only by two states, and the two stable states are allocated to "0" and "1" of data to store or retain data.

FIGS. 4A and 4B illustrate a potential state upon data reading out operation of the thyristor RAM cell.

Upon reading out operation of the thyristor RAM cell, the word line TWL is set to 0 V while the word line SWL is set to a power supply voltage VDD and the bit line BL is precharged to 0 V as seen in FIG. 4A.

At this time, while a stable point in the retaining state is maintained, the current value changes at the stable point, and consequently, data reading out operation can be carried out by reading out the current value.

FIGS. 5A and 5B illustrate a potential state upon data writing operation of the thyristor RAM.

Upon writing operation of data "1" during which the cell current is high, the word line TWL is set to the power supply voltage VDD and also the word line SWL is set to the power supply voltage VDD while the bit line BL is set to 0 V as seen in FIG. 5A.

In this potential state, since only one stable state in which the cell current is high is provided as seen in FIG. 5B, data "1" can be written.

FIGS. 6A and 6B illustrate a potential state upon writing operation of data "0" into the thyristor RAM.

Upon writing operation of data "0" during which the cell current is low, the word line TWL is set to the power supply voltage VDD and also the word line SWL is set to the power supply voltage VDD while the bit line BL is set to the power supply voltage VDD as seen in FIG. 6A.

In this potential state, since only one stable state in which the cell current is low is provided as seen in FIG. 6B, data "0" can be written.

SUMMARY OF THE INVENTION

However, the thyristor RAM cell described above cannot carry out multi-port operation.

Further, there is the possibility that, upon reading out operation of the thyristor RAM cell described above, disturb may occur.

Here, disturb upon reading out operation is described.

Although, upon reading out operation, cell current is read out after the bit line BL is reset to 0 V as described hereinabove with reference to FIGS. 4A and 4B, where the cell current reading out is carried out through the bit line BL, when the cell current is high, that is, upon reading out of data "1," the potential at the bit line BL is high, but when the cell current is low, that is, upon reading out of data "0," the potential at the bit line BL is almost equal to 0 V. In this manner, it is necessary to convert current of the bit line BL into a voltage to carry out reading out.

In this instance, as seen in FIGS. 7A and 7B, as the potential of the bit line BL rises, also the cell stable points vary. If the potential of the bit line BL becomes excessively high, then the stable point on the high cell current side regarding data "1" disappears, resulting in the possibility that the data may be broken.

For example, in such a case that the bit line BL is reset to 0 V and then the bit line BL is charged in response to cell current to carry out reading out operation as disclosed in Non-Patent Document 1 mentioned hereinabove, read disturb mentioned hereinabove may possibly occur.

Therefore, it is demanded to provide a semiconductor device which can carry out multi-port operation and can prevent occurrence of disturb upon reading out operation.

According to the present embodiment, there is provided a semiconductor device including a memory cell including a thyristor element with a gate having a pnpn structure formed in a semiconductor substrate, and a plurality of access transistors formed on the semiconductor substrate and each connected at a first terminal thereof to a storage node at one terminal of the thyristor element such that a potential at the storage node can be transmitted to bit lines different from each other, the gate of the thyristor element and the gates of the access transistors of the memory cell being connected to word lines different from one another, whereby writing operation and reading operation can be processed parallelly.

Preferably, the access transistors are connected between the corresponding bit lines and the storage node.

Preferably, the access transistors are connected between the corresponding bit lines and a predetermined potential and are connected at the gate thereof to the storage node.

Preferably, the access transistors are connected in series between the corresponding bit lines and the predetermined potential, and one of the access transistors is connected at the gate thereof to the storage node while another one of the access transistors is connected at the gate thereof to the word line.

Preferably, a word line is used commonly as the word line to which one of the access transistors is connected and the word line connected to the gate of the thyristor element and the access transistors function as writing port.

Preferably, a plurality of memory cells including the memory cell are arrayed in a matrix, and a plurality of bit lines including the bit lines are wired corresponding to the columns of the matrix array while a plurality of word lines including the word lines are wired corresponding to the rows of the matrix array.

Preferably, the semiconductor device further includes a control section which in turn includes a sense amplifier configured to compare, upon reading operation, a voltage which varies in response to cell current of each of the thyristor elements and a reference voltage with each other and output read data corresponding to a result of the comparison, and a write driver configured to drive, upon writing operation, the bit lines connected to the access transistors to a voltage corresponding to write data.

With the semiconductor device, multi-port operation is achieved, and occurrence of disturb upon reading out operation can be suppressed.

DETAILED DESCRIPTION OF THE PREFERRED EMBODIMENTS

First Embodiment

Figure 8:
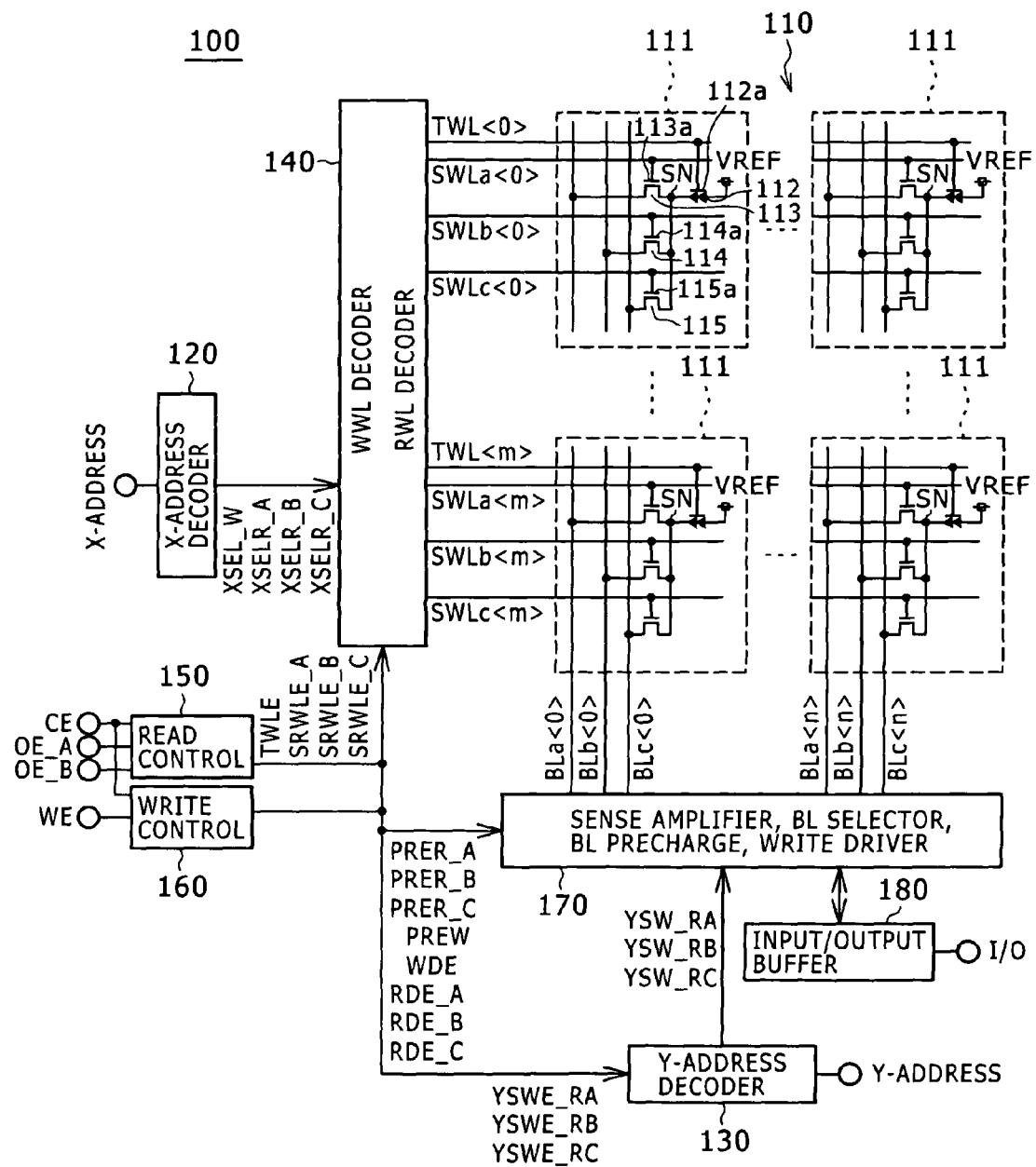
FIG. 8 is a block diagram showing a general configuration of a semiconductor device to which the present embodiment is applied.

FIG. 8 shows a general configuration of a semiconductor device to which the first embodiment of the present invention is applied.

Referring to FIG. 8, the semiconductor device 100 shown includes a memory array section 110, an X address or row address decoder 120, a Y address or column address decoder 130, a word line decoder 140, a read control section 150, a write control section 160, a Y control section or column control section 170 and an input/output buffer 180.

The word line decoder 140, read control section 150, write control section 160, Y control section or column control section 170 and so forth cooperatively form a control section.

The memory array section 110 includes a plurality of thyristor RAM cells or memory cells 111 disposed in a matrix of m rows and n columns (m×n). It is to be noted that, in FIG. 8, the thyristor RAM cells 111 are shown disposed in a matrix of 2 rows and 2 columns for simplified illustration.

Each of the thyristor RAM cells 111 includes a thyristor element 112 with a gate having a pnpn structure formed on a semiconductor layer of a bulk-type semiconductor substrate, and access transistors 113, 114 and 115 formed on the semiconductor layer of the semiconductor substrate and connected to a storage node SN which is a first terminal of the thyristor element 112.

The thyristor RAM cells 111 in the present embodiment form a 3-port RAM.

It is to be noted that the intermediate node between the first terminal of the thyristor element 112 and the access transistors 113 to 115 includes at least two stable points with regard to thyristor current and access transistor current and serves as a memory element for storing data, and the intermediate node is the storage node SN.

Figure 1:
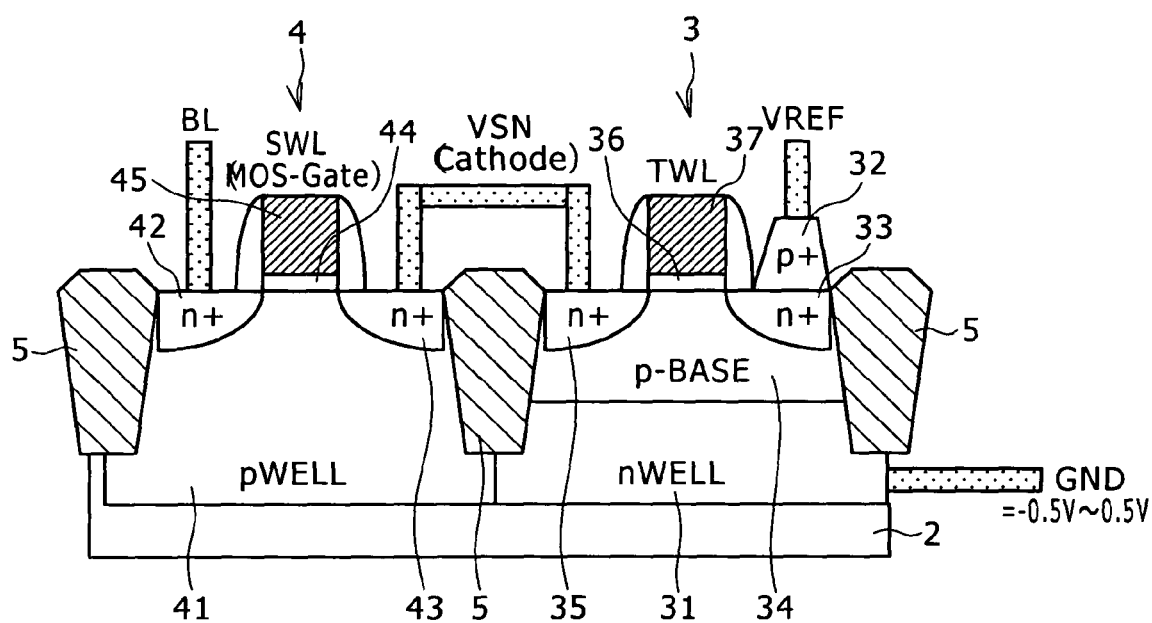
FIG. 1 is a schematic cross sectional view showing an example of a configuration of a cell of a memory device including a thyristor element and an access transistor formed on a bulk-type semiconductor substrate.
Figure 2:
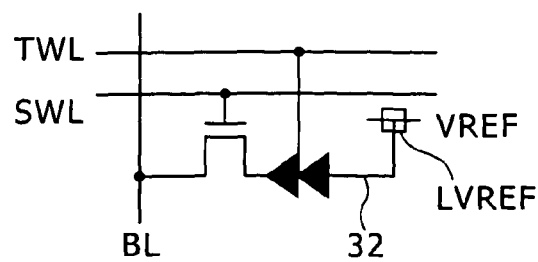
FIG. 2 is an equivalent circuit diagram of the memory device of FIG. 1.
Figure 3A:
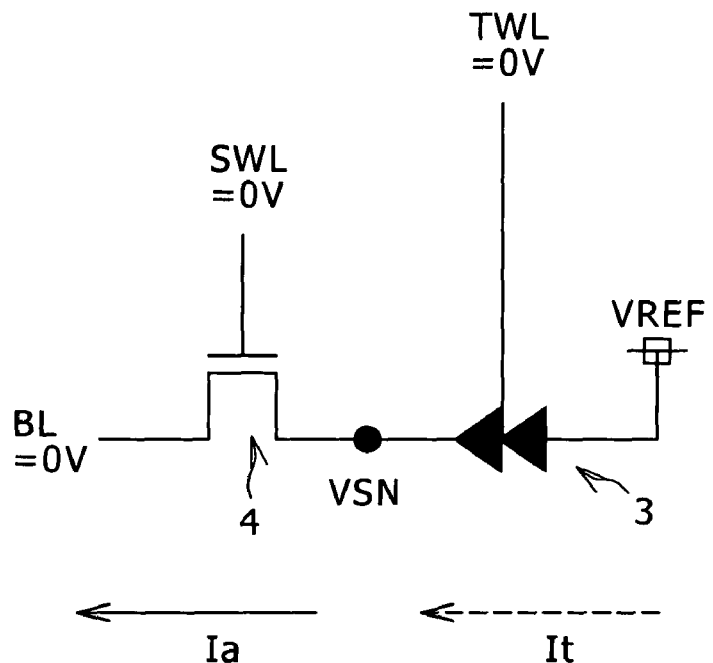
FIGS. 3A and 3B are a circuit diagram and a diagrammatic view, respectively, illustrating a potential state of a thyristor RAM cell upon data storage.
Figure 3B:
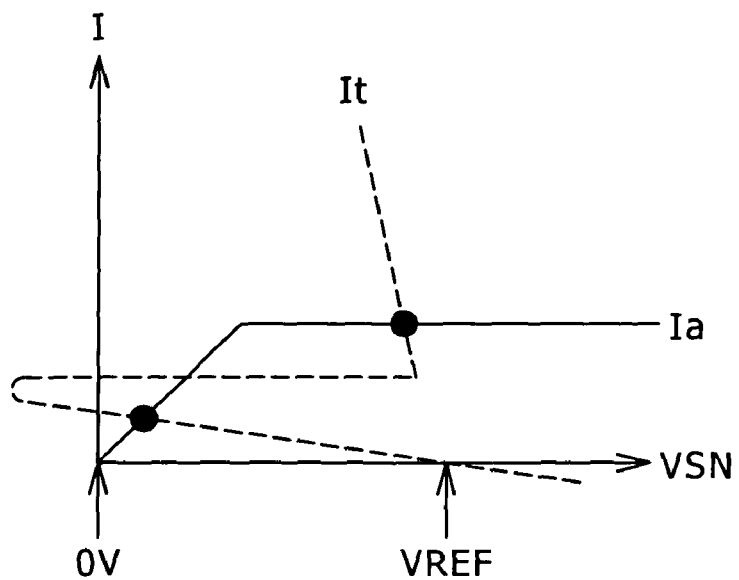
Figure 4A:
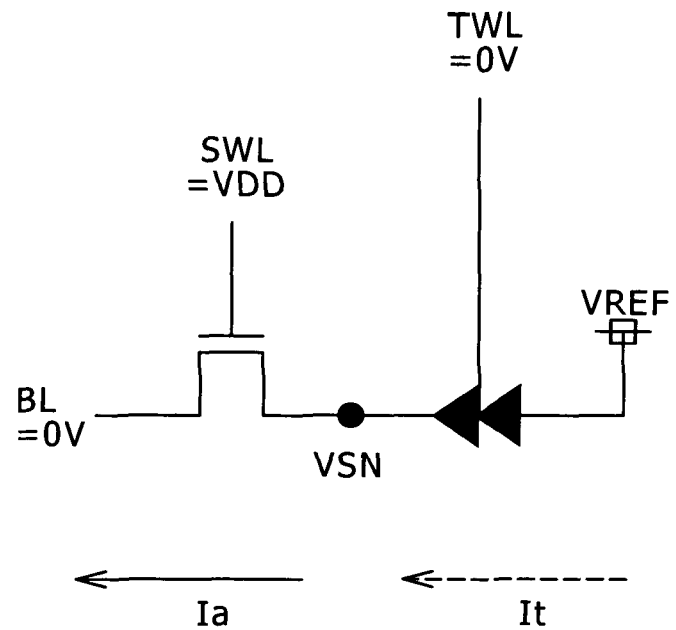
FIGS. 4A and 4B are a circuit diagram and a diagrammatic view, respectively, illustrating a potential state of the thyristor RAM cell upon data reading out operation.
Figure 4B:
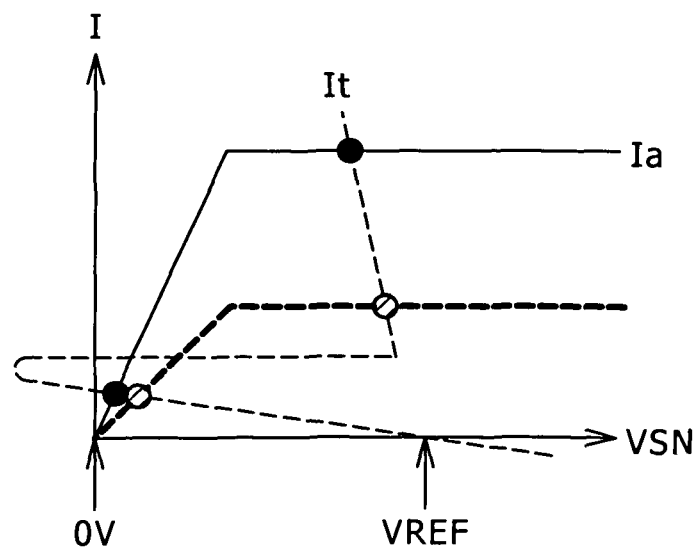

As a device structure of the thyristor RAM cell 111, for example, such a structure as described hereinabove with reference to FIG. 1 can be adopted. However, the device structure is not limited to this, but various structures may be applied.

In the memory array section 110, first word lines TWL<0> to TWL<m> for thyristors and second word lines SWLa<0> to SWLa<m>, SWLb<0> to SWLb<m> and SWLc<0> to SWLc(m) for access transistors are wired for each row individually corresponding to row arrangements of the thyristor RAM cells 111.

Further, in the memory array section 110, first bit lines BLa<0> to BLa<n>, second bit lines BLb<0> to BLb<n> and third bit lines BLc<0> to BLc<n> are wired for each column individually corresponding to column arrangements of the thyristor RAM cells 111 such that they extend perpendicularly to the first and second word lines.

Further, the gate electrodes 112a of the thyristor elements 112 of the thyristor RAM cells 111 disposed on the same row are connected commonly to one of the first word lines TWL<0> to TWL<m> which is wired in the corresponding row.

Similarly, the gate electrodes 113a of the access transistors 113 of the thyristor RAM cells 111 disposed on the same row are connected commonly to one of the second word lines SWLa<0> to SWLa<m> which is wired in the corresponding row.

The gate electrodes 114a of the access transistors 114 of the thyristor RAM cells 111 disposed on the same row are connected commonly to one of the second word lines SWLb<0> to SWLb<m> which is wired in the corresponding row.

The gate electrodes 115a of the access transistors 115 of the thyristor RAM cells 111 disposed on the same row are connected commonly to one of the second word lines SWLc<0> to SWLc<m> which is wired in the corresponding row.

Further, diffusion layers or source-drain regions on one side of the access transistors 113 of the thyristor RAM cells 111 disposed on the same column are connected commonly to one of the first bit lines BLa<0> to BLa<n> which is wired in the corresponding column.

Similarly, diffusion layers or source-drain regions on one side of the access transistors 114 of the thyristor RAM cells 111 disposed on the same column are connected commonly to one of the second bit lines BLb<0> to BLb<n> which is wired in the corresponding column.

Similarly, diffusion layers or source-drain regions on one side of the access transistors 115 of the thyristor RAM cells 111 disposed on the same column are connected commonly to one of the third bit lines BLc<0> to BLc<n> which is wired in the corresponding column.

Further, p-type anodes, which are reference potential terminals, of the thyristor elements 112 of the thyristor RAM cells 111 are connected to a reference voltage Vref. The value of the reference voltage Vref represents a voltage approximately one half that of the power supply voltage VDD and is, for example, 0.9 V where the power supply voltage VDD is 1.8 V.

The X address decoder 120 receives X addresses X0, X1, . . . and renders X select signals XSEL0, XCEL1, . . . , XSELR_A, XSELR_B and XSELR_C, which designate word lines to be selected, active, for example, to the high level. Then, the X address decoder 120 outputs the X select signal to the word line decoder 140.

Figure 9:
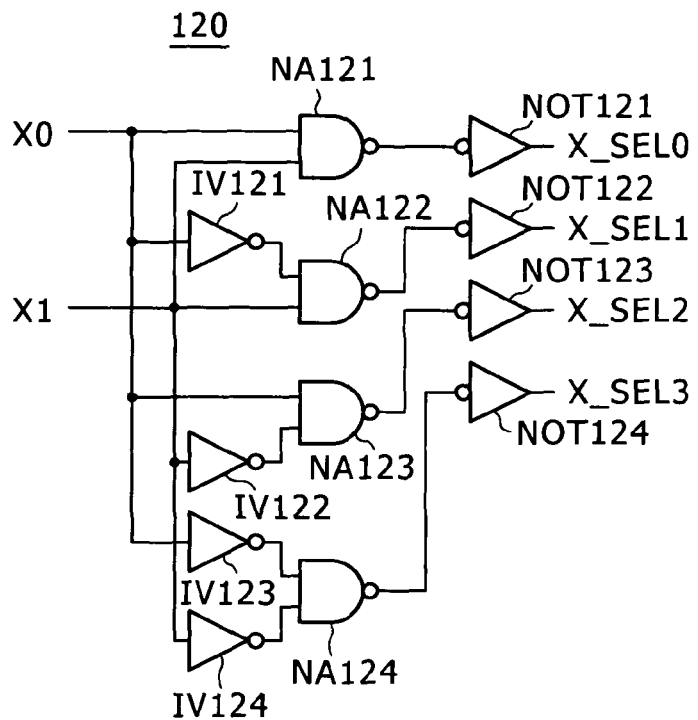
FIG. 9 is a circuit diagram showing an example of a basic configuration of an X address decoder of the semiconductor device of FIG. 8.

FIG. 9 shows an example of a basic configuration of the X address decoder according to the present embodiment.

Referring to FIG. 9, the X address decoder 120 shown has a basic configuration ready for input of the two addresses X0 and X1.

The X address decoder 120 includes 2-input NAND circuits NA121 to NA124, inverters IV121 to IV124, and NOT circuits NOT121 to NOT124.

The first inputs of the NAND circuits NA121 and NA123 and the inputs of the inverters IV121 and IV123 are connected to an input line of the X address X0.

The second input of the NAND circuit NA121, the second input of the NAND circuit NA122 and the inputs of the inverters IV122 and IV124 are connected to an input line of the X address X1. Further, the output of the inverter IV121 is connected to the first input of the NAND circuit NA122, and the output of the inverter IV122 is connected to the second input of the NAND circuit NA123. Further, the output of the inverter IV123 is connected to the first input of the NAND circuit NA124, and the output of the inverter IV124 is connected to the second input of the NAND circuit NA124.

The output of the NAND circuit NA121 is connected to the input of the NOT circuit NOT121, and the output of the NAND circuit NA122 is connected to the input of the NOT circuit NOT122. Further, the output of the NAND circuit NA123 is connected to the input of the NOT circuit NOT123, and the output of the NAND circuit NA124 is connected to the input of the NOT circuit NOT124.

In the X address decoder 120, when the X addresses (X1, X0) are (0, 0), an X select signal X_SEL3 is outputted in an active high-level state from the NOT circuit NOT124.

When the X addresses (X1, X0) is (0, 1), another X select signal X_SEL2 is outputted in an active high-level state from the NOT circuit NOT123.

When the X addresses (X1, X0) is (1, 0), a further X select signal X_SEL1 is outputted in an active high-level state from the NOT circuit NOT122.

When the X addresses (X1, X0) is (1, 1), a still further X select signal X_SEL0 is outputted in an active high-level state from the NOT circuit NOT121.

The Y address decoder 130 receives Y addresses Y0, Y1, . . . and renders complementary Y switch signals YSW_W, YSW_RA, YSW_RB and YSW_RC for selectively switching on Y switches to which bit lines are connected to be selected by a bit line selector active and inverted signals of the Y switch signals. Then, the Y address decoder 130 outputs the Y switch signals and the inverted signals to the Y control section 170.

Figure 10:
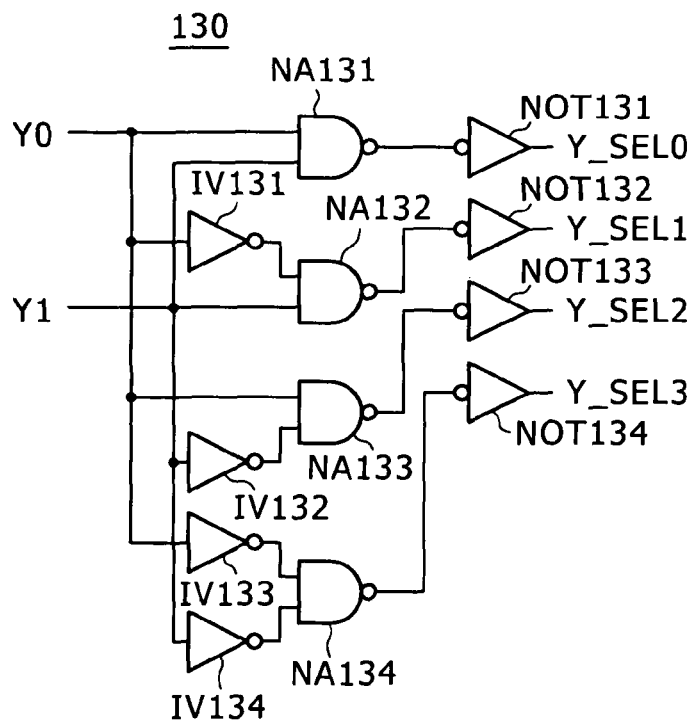
FIG. 10 is a circuit diagram showing an example of a basic configuration of a Y address decoder of the semiconductor device of FIG. 8.

FIG. 10 shows an example of a basic configuration of the Y address decoder used in the present embodiment.

Referring to FIG. 10, the Y address decoder 130 shown has, as a basic configuration, a configuration ready for inputs of two addresses Y0 and Y1.

The Y address decoder 130 includes 2-input NAND circuits NA131 to NA134, inverters IV131 to IV134, and NOT circuits NOT131 to NOT134.

The first inputs of the NAND circuits NA131 and NA133 and the inputs of the inverters IV131 and IV133 are connected to an input line for the Y address Y0.

The second input of the NAND circuit NA131, the second input of the NAND circuit NA132 and the inputs of the inverters IV132 and IV134 are connected to an input line for the Y address Y1. Further, the output of the inverter IV131 is connected to the first input of the NAND circuit NA132, and the output of the inverter IV132 is connected to the second input of the NAND circuit NA133. Further, the output of the inverter IV133 is connected to the first input of the NAND circuit NA134, and the output of the inverter IV134 is connected to the second input of the NAND circuit NA134.

The output of the NAND circuit NA131 is connected to the input of the NOT circuit NOT131, and the output of the NAND circuit NA132 is connected to the input of the NOT circuit NOT132. Further, the output of the NAND circuit NA133 is connected to the input of the NOT circuit NOT133, and the output of the NAND circuit NA134 is connected to the input of the NOT circuit NOT134.

In the Y address decoder 130, when the Y addresses (Y1, Y0) are (0, 0), a Y select signal Y_SEL3 is outputted in an active high-level state from the NOT circuit NOT134.

When the Y addresses (Y1, Y0) is (0, 1), another Y select signal Y_SEL2 is outputted in an active high-level state from the NOT circuit NOT133.

When the Y addresses (Y1, Y0) is (1, 0), a further Y select signal Y_SEL1 is outputted in an active high-level state from the NOT circuit NOT132.

When the Y addresses (Y1, Y0) is (1, 1), a still further Y select signal Y_SEL0 is outputted in an active high-level state from the NOT circuit NOT131.

Figure 11:
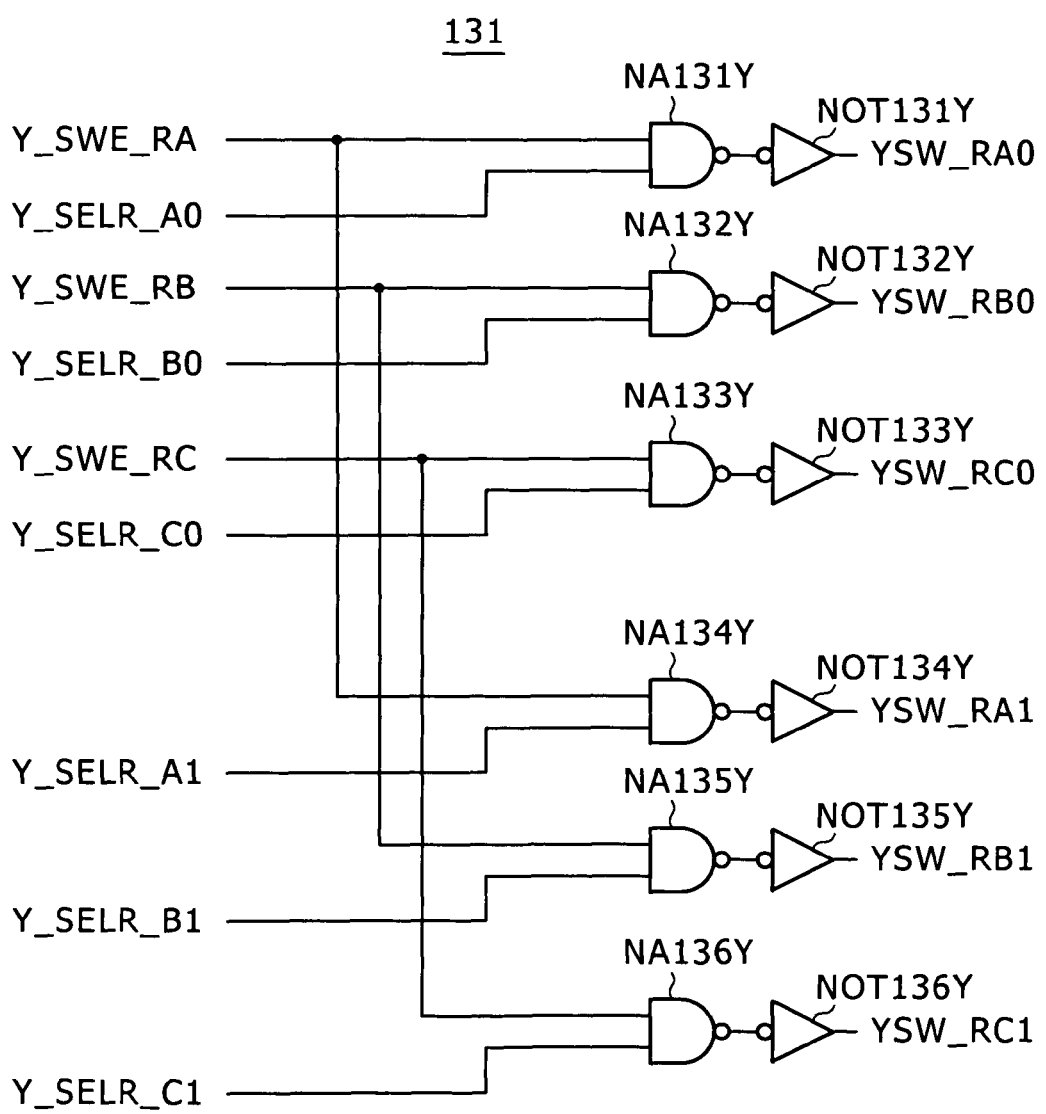
FIG. 11 is a circuit diagram showing an example of a configuration of a YSW decoder used in the Y address decoder of FIG. 10.

FIG. 11 shows an example of a configuration of the YSW decoder in the Y address decoder in the present embodiment.

Referring to FIG. 11, the YSW decoder 131 shown includes 2-input NAND circuits NA131Y to NA136Y and NOT circuits NOT131Y to NOT136Y.

A Y select signal Y_SELR_A0 produced by the YSW decoder 131 and a Y switch enable signal YSWE_RA from the read control section 150 or the write control section 160 are inputted to the NAND circuit NA131Y, and a result of NANDing by the NAND circuit NA131Y is outputted as an activated Y switch signal YSW_RA0 through the NOT circuit NOT131Y.

A Y select signal Y_SELR_B0 produced by the YSW decoder 131 and a Y switch enable signal YSWE_RB from the read control section 150 or the write control section 160 are inputted to the NAND circuit NA132Y, and a result of NANDing by the NAND circuit NA132Y is outputted as an activated Y switch signal YSW_RB0 through the NOT circuit NOT132Y.

A Y select signal Y_SELR_C0 produced by the YSW decoder 131 and a Y switch enable signal YSWE_RC from the read control section 150 or the write control section 160 are inputted to the NAND circuit NA133Y, and a result of NANDing by the NAND circuit NA133Y is outputted as an activated Y switch signal YSW_RC0 through the NOT circuit NOT133Y.

A Y select signal Y_SELR_A1 produced by the YSW decoder 131 and a Y switch enable signal YSWE_RA from the read control section 150 or the write control section 160 are inputted to the NAND circuit NA134Y, and a result of NANDing by the NAND circuit NA134Y is outputted as an activated Y switch signal YSW_RA1 through the NOT circuit NOT134Y.

A Y select signal Y_SELR_B1 produced by the YSW decoder 131 and a Y switch enable signal YSWE_RB from the read control section 150 or the write control section 160 are inputted to the NAND circuit NA135Y, and a result of NANDing by the NAND circuit NA135Y is outputted as an activated Y switch signal YSW_RB1 through the NOT circuit NOT135Y.

A Y select signal Y_SELR_C1 produced by the YSW decoder 131 and a Y switch enable signal YSWE_RC from the read control section 150 or the write control section 160 are inputted to the NAND circuit NA136Y, and a result of NANDing by the NAND circuit NA136Y is outputted as an activated Y switch signal YSW_RC1 through the NOT circuit NOT136Y.

Only the Y switch signal YSW designated by the output Y_SEL of the YSW decoder 131 is activated by the signal YSEW. Upon reading out and upon writing, the Y switch signal YSW is activated for each of the ports.

Referring back to FIG. 8, the word line decoder 140 drives a first word line TWL and second word lines SWLa, SWLb and SWLC designated by the X addresses in response to the X select signals X_SEL (XSELW, XSELR_A, XSELR_B and XSELR_C) from the X address decoder 120 and the first word line enable signal TWLE and the second word line enable signals SWLE_A, SWLE_B and SWLE_C from the read control section 150 or the write control section 160. In other words, the word line decoder 140 sets the first word line TWL and the second word lines SWLa, SWLb and SWLc to the high level.

It is to be noted that, upon reading out operation, the second word line enable signal SWLE is activated, but upon writing operation, both of the first word line enable signal TWLE and the second word line enable signal SWLE are activated.

Figure 12:
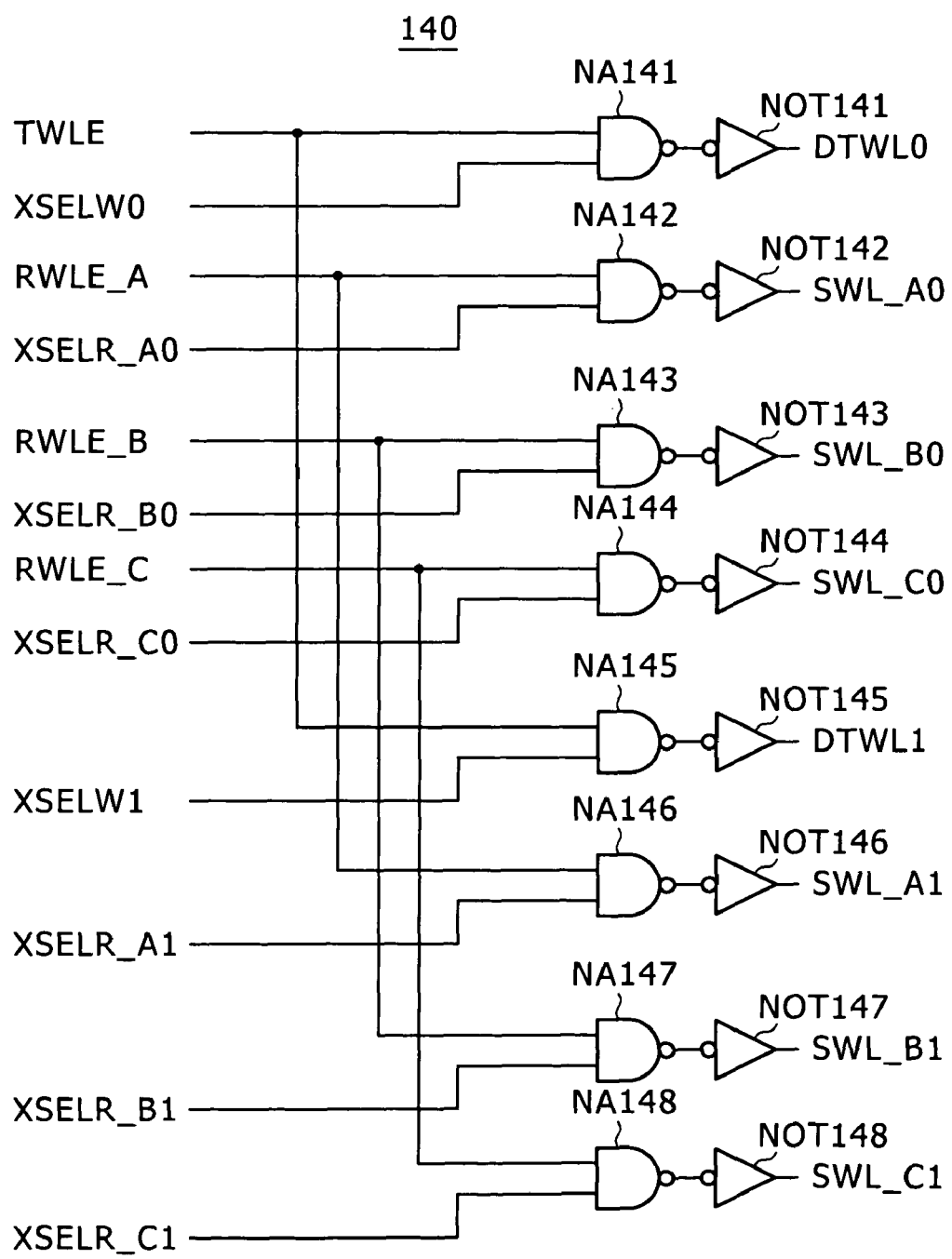
FIG. 12 is a circuit diagram showing an example of a configuration of a word line decoder of the semiconductor device of FIG. 8.

FIG. 12 shows an example of a configuration of the word line decoder in the present embodiment.

Referring to FIG. 12, the word line decoder 140 includes 2-input NAND circuits NA141 to NA148 and NOT circuits NOT141 to NOT148.

An X select signal X_SELW0 produced by the X address decoder 120 and a first word line enable signal TWLE from the read control section 150 or the write control section 160 are inputted to the NAND circuit NA141, and a result of NANDing by the NAND circuit NA141 is outputted as an activated driving signal DTWL0 through the NOT circuit NOT141 to drive the first word line TWL0 of the row designated by the X address.

An X select signal X_SELR_A0 produced by the X address decoder 120 and a second word line enable signal RWLE_A from the read control section 150 or the write control section 160 are inputted to the NAND circuit NA142, and a result of NANDing by the NAND circuit NA142 is outputted as a driving signal SWL_A0 through the NOT circuit NOT142 to drive the second word line SWLa<0> of the row designated by the X address.

An X select signal X_SELR_B0 produced by the X address decoder 120 and a second word line enable signal RWLE_B from the read control section 150 or the write control section 160 are inputted to the NAND circuit NA143, and a result of NANDing by the NAND circuit NA143 is outputted as a driving signal SWL_B0 through the NOT circuit NOT143 to drive the second word line SWLb<0> of the row designated by the X address.

An X select signal X_SELR_C0 produced by the X address decoder 120 and a second word line enable signal RWLE_C from the read control section 150 or the write control section 160 are inputted to the NAND circuit NA144, and a result of NANDing by the NAND circuit NA144 is outputted as a driving signal SWL_C0 through the NOT circuit NOT144 to drive the second word line SWLc<0> of the row designated by the X address.

An X select signal X_SELW1 produced by the X address decoder 120 and a first word line enable signal TWLE from the read control section 150 or the write control section 160 are inputted to the NAND circuit NA145, and a result of NANDing by the NAND circuit NA145 is outputted as an activated driving signal DTWL1 through the NOT circuit NOT141 to drive a first word line TWL1 of the row designated by the X address.

An X select signal X_SELR_A1 produced by the X address decoder 120 and a second word line enable signal RWLE_A from the read control section 150 or the write control section 160 are inputted to the NAND circuit NA146, and a result of NANDing by the NAND circuit NA146 is outputted as an activated driving signal SWL_A1 through the NOT circuit NOT146 to drive the second word line SWLa<1> of the row designated by the X address.

An X select signal X_SELR_BL produced by the X address decoder 120 and a second word line enable signal RWLE_B from the read control section 150 or the write control section 160 are inputted to the NAND circuit NA147, and a result of NANDing by the NAND circuit NA147 is outputted as an activated driving signal SWL_BL through the NOT circuit NOT147 to drive the second word line SWLb<1> of the row designated by the X address.

An X select signal X_SELR_C1 produced by the X address decoder 120 and a second word line enable signal RWLE_C from the read control section 150 or the write control section 160 are inputted to the NAND circuit NA148, and a result of NANDing by the NAND circuit NA148 is outputted as an activated driving signal SWL_C1 through the NOT circuit NOT148 to drive the second word line SWLc<1> of the row designated by the X address.

The read control section 150 receives a chip enable signal CE and output enable signals OE_A and OW_B from the outside to decide whether or not the current mode is a reading out mode.

If the read control section 150 decides that the current mode is a reading out mode, then it outputs the second word line enable signal SWLE (SWLE_A, SWLE_B or SWLE_C) in an active high-level state to the word line decoder 140.

Then, within a reading out period, the read control section 150 changes over the read precharge signal PRER (PRER_A, PRER_B or PRER_C) from the high level to the low level to set a read data enable signal or reading out activation signal RDE (RDE_A, RDE_B or RDE_C) to the high level, a write data enable signal or writing activation signal WDE (WDE_A, WDE_B or WDE_C) to the low level and a Y switch enable signal YSWE (YSWE_RA, YSWE_RB or YSWE_RC) to the high level. Then, the read control section 150 outputs the read data enable signal RDE, write data enable signal WDE and Y switch enable signal YSWE to the Y control section 170.

The write control section 160 receives a chip enable signal CE and a write enable signal WE from the outside to decide whether or not the current mode is a writing mode.

If the write control section 160 decides that the current mode is a writing mode, then it outputs the first word line enable signal TWLE and the second word line enable signal SWLE (SWLE_A, SWLE_B or SWLE_C) in an active high-level state to the word line decoder 140. Then, within a writing period, the write control section 160 changes over the write precharge signal PREW from the high level to the low level to set the read precharge signal PRER (PRER_A, PRER_B or PRER_C) to the low level, write data enable signal WDE to the high level, read data enable signal RDE (RDE_A, RDE_B or RDE_C) to the low level and Y switch enable signal YSWE (YSWE_RA, YSWE_RB or YSWE_RC) to the high level. Then, the write control section 160 outputs the read precharge signal PRER, write data enable signal WDE, read data enable signal RDE and Y switch enable signal YSWE to the Y control section 170.

The Y control section 170 carries out precharge control of the first bit lines BLa<0> to BLa<n>, second bit lines BLb<0> to BLb<n> and third bit lines BLc<0> to BLc<n>, and voltage control of the first bit lines BLa<0> to BLa<n>, second bit lines BLb<0> to BLb<n> and third bit lines BLc<0> to BLc<n> upon writing operation and reading out operation. The Y control section 170 further carries out transfer control of write data to the first bit lines BLa<0> to BLa<n>, second bit lines BLb<0> to BLb<n> and third bit lines BLc<0> to BLc<n> and transfer control of read data to a sense amplifier (SA) including on/off control of the Y switch of the Y selector by the Y switch signal YSW.

Figure 13:
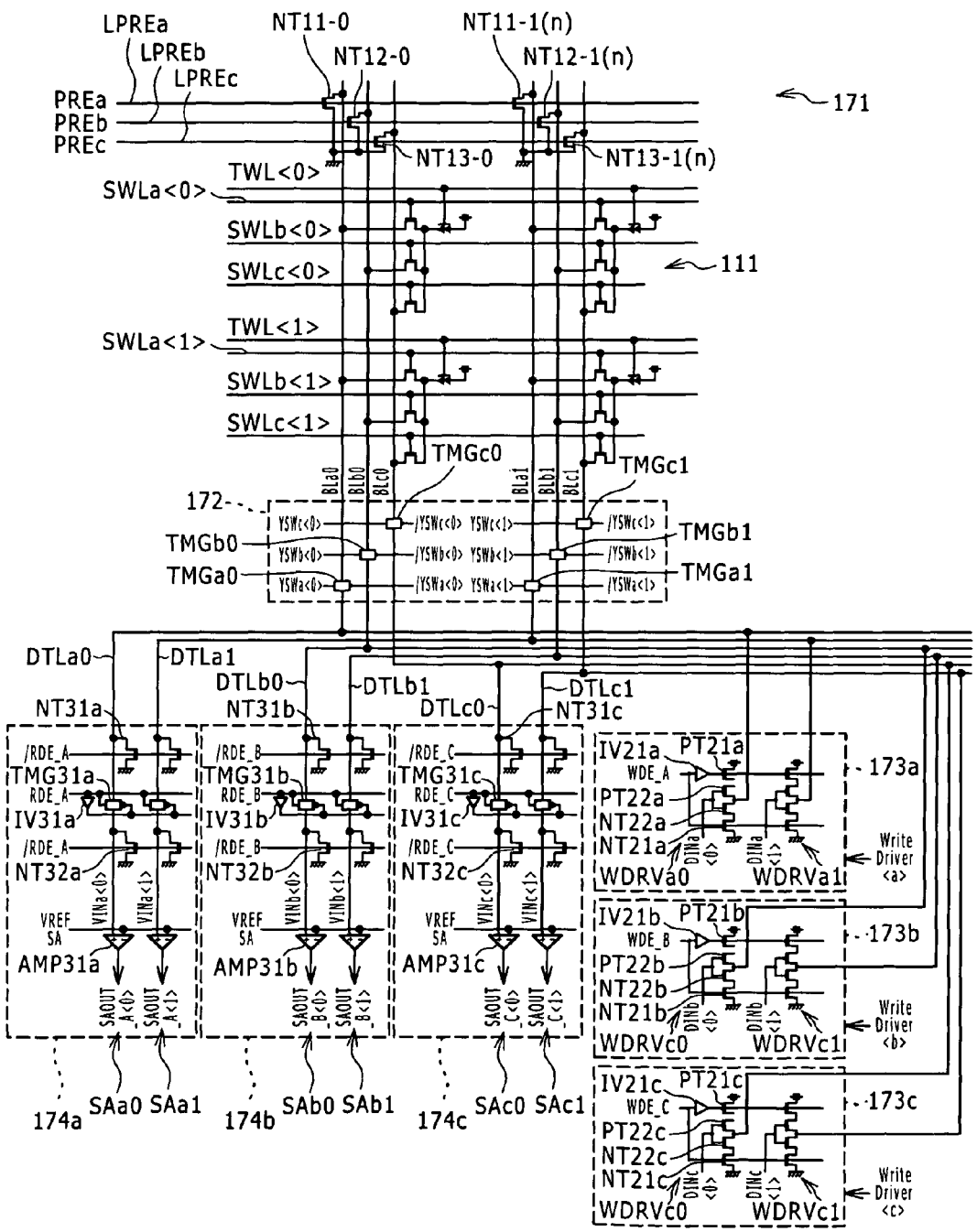
FIG. 13 is a circuit diagram showing an example of a configuration of a Y control section of the semiconductor device of FIG. 8.

As described above, the Y control section 170 has a sense amplifier for reading out operation, and the reading out control section of the Y control section 170 can be configured, for example, in such a manner as seen in FIG. 13.

Here, an example of a more particular configuration of the Y control section 170 is described.

FIG. 13 shows an example of a configuration of the Y control section in the present embodiment.

Referring to FIG. 13, the Y control section 170 includes a precharge circuit 171, a Y selector 172, write driver groups 173a, 173b and 173c, and sense amplifier (SA) groups 174a, 174b and 174c.

The precharge circuit 171 includes NMOS transistors NT11-0 to NT11-n, NMOS transistors NT12-0 to NT12-n, and NMOS transistors NT13-0 to NT13-n.

The NMOS transistors NT11-0 to NT11-n are connected at the source and the drain thereof to a ground potential GND and first bit lines BLa0 to BLan, respectively, and at the gate thereof commonly to a supply line LPREa for a precharge signal PREa.

The NMOS transistors NT12-0 to NT12-n are connected at the source and the drain thereof to the ground potential GND and the second bit lines BLb0 to BLbn, respectively, and at the gate thereof commonly to a supply line LPREb for a precharge signal PREb.

The NMOS transistors NT13-0 to NT13-n are connected at the source and the drain thereof to the ground potential GND and the third bit lines BLc0 to BLcn, respectively, and at the gate thereof commonly to a supply line LPREc for a precharge signal PREc.

The Y selector 172 includes first Y transfer gate switches TMGa0 to TMGan for controlling connection between the first bit lines BLa0 to BLan and first data transfer lines DTLa0 to DTLan by a Y switch signal YSWa and an inverted signal/YSWa of the Y switch signal YSWa produced in response to an address, second Y transfer gate switches TMGb0 to TMGbn for controlling connection between the second bit lines BLb0 to BLbn and second data transfer lines DTLb0 to DTLbn by a Y switch signal YSWb and an inverted signal/YSWb of the Y switch signal YSWb produced in response to the address, and third Y transfer gate switches TMGc0 to TMGcn for controlling connection between the third bit lines BLc0 to BLcn and third data transfer lines DTLc0 to DTLcn by a Y switch signal YSWc and an inverted signal/YSWc of the Y switch signal YSWc produced in response to the address.

It is to be noted that the Y transfer gate switch is formed from an NMOS transistor and a PMOS transistor which are connected at the source and the drain thereof to each other.

The write driver group 173a includes a plurality of write drivers WDRVa0 to WDRVan for transferring input data DINa<0> to DINa<n> to the first data transfer lines DTLa0 to DTLan, respectively.

The write drivers WDRVa1 to WDRVan have a common configuration and are each formed as a clocked inverter which receives a write data enable signal WDE_A as a trigger.

Each write driver WDRVa includes PMOS transistors PT21a and PT22a, NMOS transistors NT21a and NT22a and an inverter IV21a.

The PMOS transistor PT21a is connected at the source thereof to a supply line for the power supply voltage VDD and at the drain thereof to the source of the PMOS transistor PT22a. The PMOS transistor PT22a is connected at the drain thereof to the drain of the NMOS transistor NT22a, and the NMOS transistor NT22a is connected at the source thereof to the drain of the NMOS transistor NT21a. The NMOS transistor NT21a is grounded at the source thereof. The inverter IV21a is connected at the input terminal thereof to a supply line for the write data enable signal WDE_A.

The PMOS transistors PT21a of the write drivers WDRVa1 to WDRVan are connected commonly at the gate thereof to the output of the inverter IV21a, and the NMOS transistors NT21a of the write drivers WDRVa1 to WDRVan are connected commonly at the gate thereof to a supply line of the write data enable signal WDE_A.

The PMOS transistors PT22a and the NMOS transistors NT22a of the write drivers WDRVa1 to WDRVan are connected at the gate thereof to input lines for input data DINa<0> to DINa<n>.

The write driver group 173b includes a plurality of write drivers WDRVb0 to WDRVbn for transferring input data DINb<0> to DINb<n> to the second data transfer lines DTLb0 to DTLbn, respectively.

The write drivers WDRVb1 to WDRVbn have a common configuration and are each formed as a clocked inverter which receives a write data enable signal WDE_B as a trigger.

Each write driver WDRVb includes PMOS transistors PT21b and PT22b, NMOS transistors NT21b and NT22b and an inverter IV21b.

The PMOS transistor PT21b is connected at the source thereof to the supply line for the power supply voltage VDD and at the drain thereof to the source of the PMOS transistor PT22b. The PMOS transistor PT22b is connected at the drain thereof to the drain of the NMOS transistor NT22b, and the NMOS transistor NT22b is connected at the source thereof to the drain of the NMOS transistor NT21b. The NMOS transistor NT21b is grounded at the source thereof. The inverter IV21b is connected at the input terminal thereof to the supply line for the write data enable signal WDE_B.

The PMOS transistors PT21b of the write drivers WDRVb1 to WDRVbn are connected commonly at the gate thereof to the output of the inverter IV21b, and the NMOS transistors NT21b of the write drivers WDRVb1 to WDRVbn are connected commonly at the gate thereof to the supply line of the write data enable signal WDE_B.

The PMOS transistors PT22b and the NMOS transistors NT22b of the write drivers WDRVb1 to WDRVbn are connected at the gate thereof to input lines for input data DINb<0> to DINb<n>.

The write driver group 173c includes a plurality of write driver WDRVc0 to WDRVcn for transferring input data DINc<0> to DINc<n> to the third data transfer lines DTLc0 to DTLcn, respectively.

The write drivers WDRVc1 to WDRVcn have a common configuration and are each formed as a clocked inverter which receives a write data enable signal WDE_C as a trigger.

Each write driver WDRVc includes PMOS transistors PT21c and PT22c, NMOS transistors NT21c and NT22c and an inverter IV21c.

The PMOS transistor PT21c is connected at the source thereof to the supply line for the power supply voltage VDD and at the drain thereof to the source of the PMOS transistor PT22c. The PMOS transistor PT22c is connected at the drain thereof to the drain of the NMOS transistor NT22c, and the NMOS transistor NT22c is connected at the source thereof to the drain of the NMOS transistor NT21c. The NMOS transistor NT21c is grounded at the source thereof. The inverter IV21c is connected at the input terminal thereof to the supply line for the write data enable signal WDE_C.

The PMOS transistors PT21c of the write drivers WDRVc1 to WDRVcn are connected commonly at the gate thereof to the output of the inverter IV21c, and the NMOS transistors NT21c of the write drivers WDRVc1 to WDRVcn are connected commonly at the gate thereof to the supply line of the write data enable signal WDE_C.

The PMOS transistors PT22c and the NMOS transistors NT22c of the write drivers WDRVc1 to WDRVcn are connected at the gate thereof to input lines for input data DINc<0> to DINc<n>.

The sense amplifier group 174a has a plurality of sense amplifiers SAa0 to SAan for sensing and reading out read data transferred along the first data transfer lines DTLa0 to DTLan, respectively.

The sense amplifiers SAa0 to SAan have a common configuration and each includes a negative feedback amplifier AMP31a, a transfer gate TMG31a, NMOS transistors NT31a and NT32a and an inverter IV31a.

The transfer gate TMG31a is formed from an NMOS transistor and a PMOS transistor connected at the source and the drain thereof to each other, and is connected at an input and output terminal on one side thereof to first data transfer lines DTLa0 to DTLan and one of the source/drain of the NMOS transistor NT31a. Meanwhile, the transfer gate TMG31a is connected at the other input and output terminal thereof to the non-negated input terminal (+) of the negative feedback amplifier AMP31a and one of the source/drain of the NMOS transistor NT32a.

The NMOS transistor of the transfer gate TMG31a is connected at the gate thereof to a supply line for a read data enable signal RDE_A, and the PMOS transistor of the transfer gate TMG31a is connected at the gate thereof to the supply line for the read data enable signal RDE_A through the inverter IV31a.

The transfer gate TMG31a is placed into an on state, that is, into a conducting state, in response to the read data enable signal RDE_A supplied thereto in an active state.

The negative feedback amplifier AMP31a is connected at the negated input terminal (−) thereof to a supply line for a reference voltage VREFSA.

The NMOS transistor NT31a is connected at the other one of the source/drain thereof to the ground potential GND and is connected to a supply line for the inverted signal /RDE_A of the read data enable signal RDE_A.

The NMOS transistor NT32a is connected at the other one of the source/drain thereof to the ground potential GND and is connected to the supply line for the inverted signal /RDE_A of the read data enable signal RDE_A.

The sense amplifier group 174b includes a plurality of sense amplifiers SAb0 to SAbn for sensing and reading out read data transferred through the second data transfer lines DTLb0 to DTLbn, respectively.

The sense amplifiers SAb0 to SAbn have a common configuration and each includes a negative feedback amplifier AMP31b, a transfer gate TMG31b, NMOS transistors NT31b and NT32b and an inverter IV31b.

The transfer gate TMG31b is formed from an NMOS transistor and a PMOS transistor connected at the source and the drain thereof to each other, and is connected at an input and output terminal on one side thereof to the second data transfer lines DTLb0 to DTLbn and one of the source/drain of the NMOS transistor NT31b. Meanwhile, the transfer gate TMG31b is connected at the other input and output terminal thereof to the non-negated input terminal (+) of the negative feedback amplifier AMP31b and one of the source/drain of the NMOS transistor NT32b.

The NMOS transistor of the transfer gate TMG31b is connected at the gate thereof to a supply line for a read data enable signal RDE_B, and the PMOS transistor of the transfer gate TMG31b is connected at the gate thereof to the supply line for the read data enable signal RDE_B through the inverter IV31b.

The transfer gate TMG31b is placed into an on state, that is, into a conducting state, in response to the read data enable signal RDE_B supplied thereto in an active state.

The negative feedback amplifier AMP31b is connected at the negated input terminal (−) thereof to a supply line for a reference voltage VREFSA.

The NMOS transistor NT31b is connected at the other one of the source/drain thereof to the ground potential GND and is connected to a supply line for the inverted signal /RDE_B of the read data enable signal RDE_B.

The NMOS transistor NT32b is connected at the other one of the source/drain thereof to the ground potential GND and is connected to the supply line for the inverted signal /RDE_B of the read data enable signal RDE_B.

The sense amplifier group 174c includes a plurality of sense amplifiers SAc0 to SAcn for sensing and reading out read data transferred through the third data transfer lines DTLc0 to DTLcn, respectively.

The sense amplifiers SAc0 to SAcn have a common configuration and each includes a negative feedback amplifier AMP31c, a transfer gate TMG31c, NMOS transistors NT31c and NT32c and an inverter IV31c.

The transfer gate TMG31c is formed from an NMOS transistor and a PMOS transistor connected at the source and the drain thereof to each other, and is connected at an input and output terminal on one side thereof to the third data transfer lines DTLc0 to DTLcn and one of the source/drain of the NMOS transistor NT31c. Meanwhile, the transfer gate TMG31c is connected at the other input and output terminal thereof to the non-negated input terminal (+) of the negative feedback amplifier AMP31c and one of the source/drain of the NMOS transistor NT32c.

The NMOS transistor of the transfer gate TMG31c is connected at the gate thereof to a supply line for a read data enable signal RDE_C, and the PMOS transistor of the transfer gate TMG31c is connected at the gate thereof to the supply line for the read data enable signal RDE_C through the inverter IV31c.

The transfer gate TMG31c is placed into an on state, that is, into a conducting state, in response to the read data enable signal RDE_C supplied thereto in an active state.

The negative feedback amplifier AMP31c is connected at the negated input terminal (−) thereof to the supply line for the reference voltage VREFSA.

The NMOS transistor NT31c is connected at the other one of the source/drain thereof to the ground potential GND and is connected to a supply line for the inverted signal/RDE_C of the read data enable signal RDE_C.

The NMOS transistor NT32c is connected at the other one of the source/drain thereof to the ground potential GND and is connected to the supply line for the inverted signal/RDE_C of the read data enable signal RDE_C.

Figure 14:
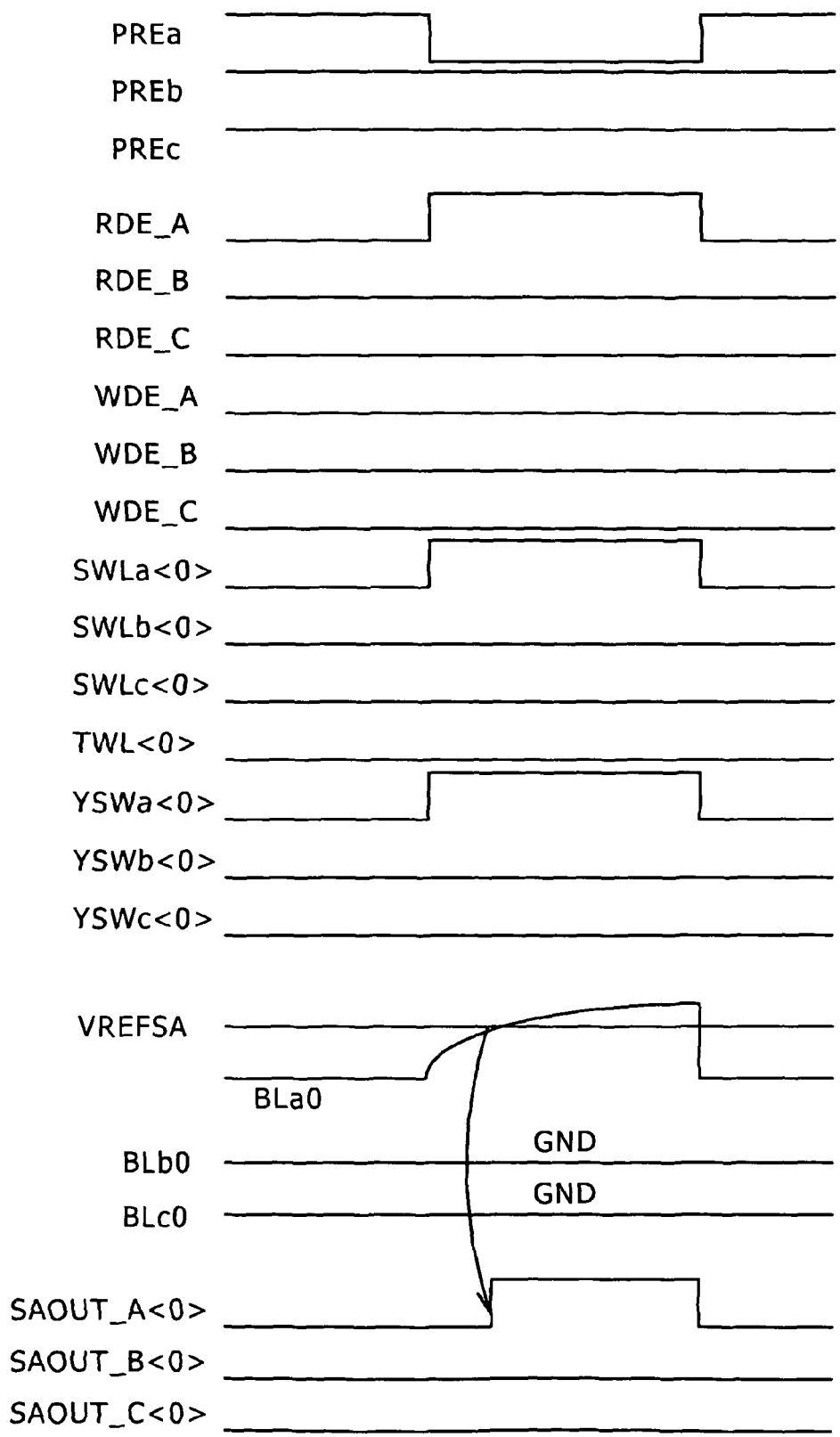
FIG. 14 is a waveform diagram illustrating operation of the semiconductor device of FIG. 8 upon reading out of data from cells on a second word line where the data is 1 and cell current is high.
Figure 15:
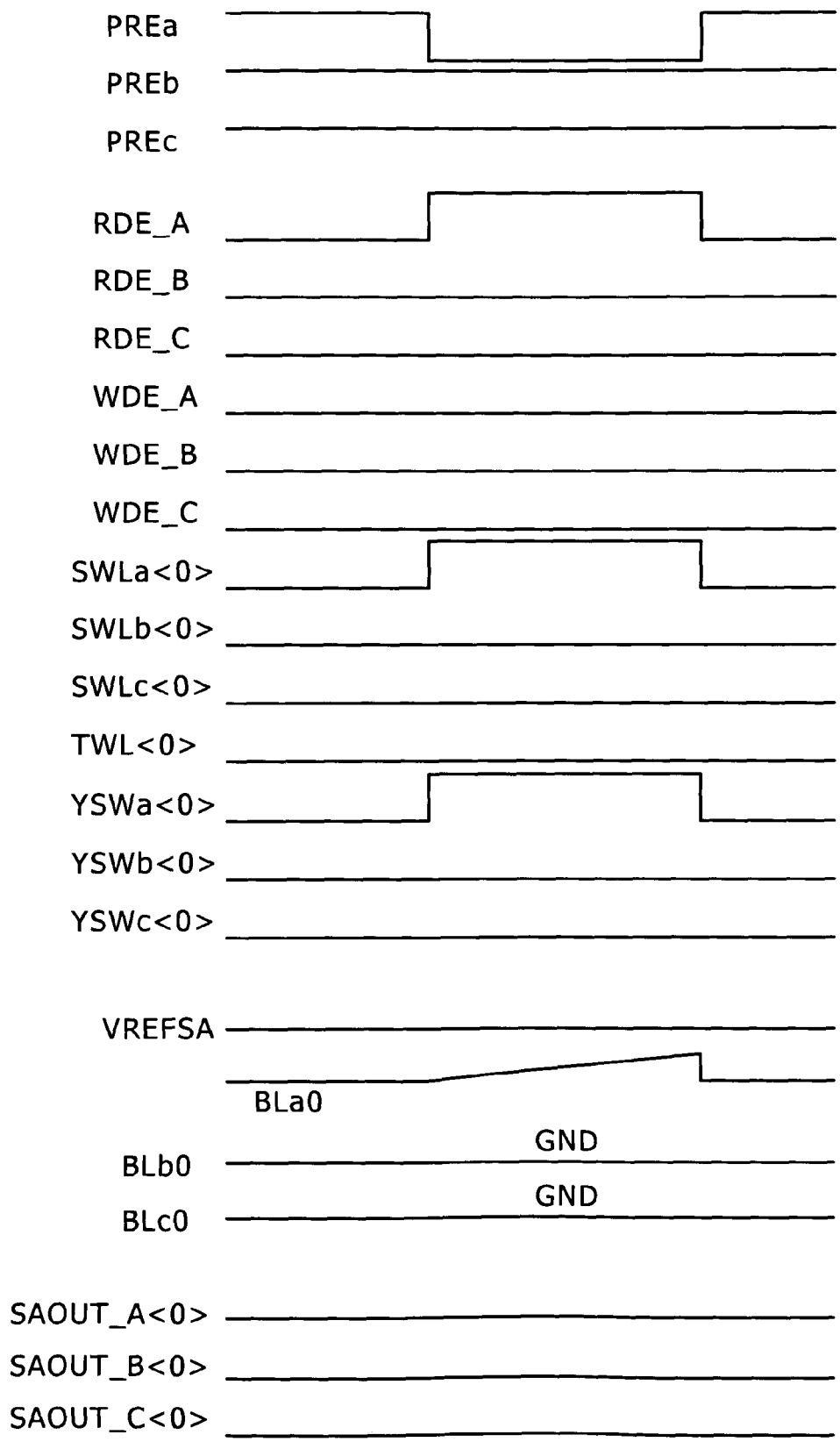
FIG. 15 is a similar view but illustrating operation of the semiconductor device of FIG. 8 upon reading out of data from the cells on the second word line where the data is 0 and cell current is low.
Figure 16:
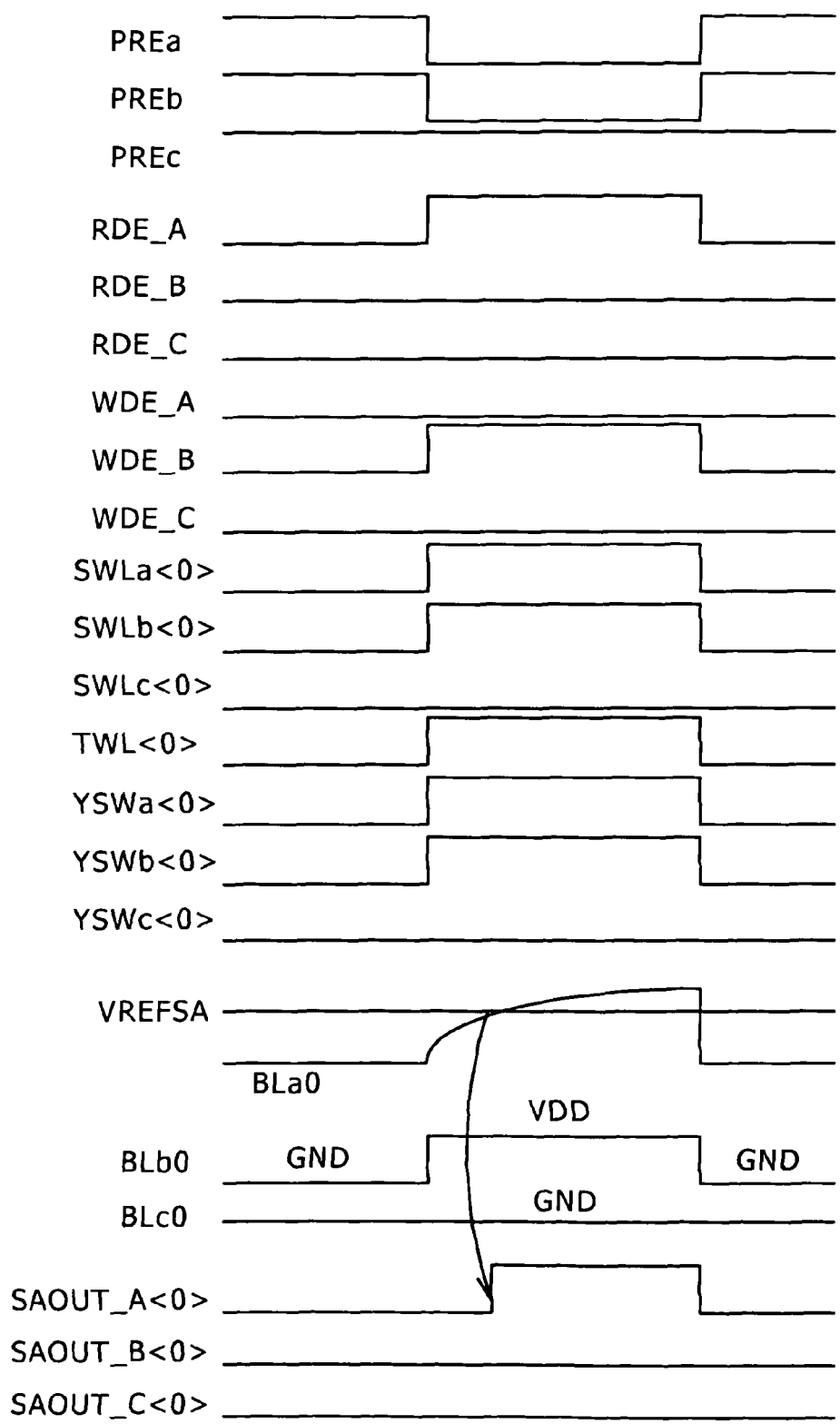
FIG. 16 is a similar view but illustrating operation of the semiconductor device of FIG. 8 upon reading out of data from the cells on the second word line where the data is 1 and cell current is high and upon writing of data into the cells on the second word line where the data is 1 and cell current is high.

Now, operation of the semiconductor device having the configuration described above is described principally with regard to operation of the Y control section 170 with reference to FIGS. 14 to 16.

First, reading out operation of memory cell data is described.

FIG. 14 illustrates operation upon reading out of data 1 from cells of the second word line SWLa<0> where the cell current is high.

In this instance, in a standby state, the precharge signal PREa is supplied in a high level state, and as a result, the bit line BLa0 is held at the ground potential GND or is reset.

At this time, the read data enable signals or reading out activation signals RDE_A, RDE_B and RDE_C, write data enable signals or writing activation signals WDE_A, WDE_B and WDE_C, second word lines SWLa, SWLb and SWLc, first word line TWL and Y switch signals YSWa, YSWb and YSWc are set to the ground potential GND.

Then, when a reading out mode is entered, the desired second word line SWLa<0> rises to the high level and the cell current of the thyristor RAM cells 111 is placed into an on state, that is, cell current flows through the thyristor RAM cells 111.

Further, the precharge signal PREa falls from the high level, that is, the power supply voltage level, to the low level, that is, to the ground potential level. Consequently, the bit line BLa0 enters a floating state from the ground potential GND.

Further, the desired Y switch signal YSWa<0> and the read data enable signal RDE_A rise to the high level to turn on the transfer gate TMG31, whereupon the sense amplifier SA and the bit line BLa0 are connected to each other through the first data transfer line DTLa0.

Since, upon reading out of high data, that is, data 1, the cell current is high, the bit line BLa0 is gradually charged from the ground potential GND by the cell. Here, if the potential at the bit line BLa0 becomes higher than the reference voltage VREFSA, then the sense amplifier SA outputs a decision of 1 and the output SAOUT changes to the high level.

FIG. 15 illustrates operation of reading out of data 0 from the cells on the second word line SWLa<0> where the cell current is low.

In this instance, although the operation is basically same as that described hereinabove with reference to FIG. 14, since the cell current is low, the charge amount of the bit line BLa0 is small. Therefore, the sense amplifier SA outputs a decision of 0.

Now, writing operation of data into a memory cell is described.

FIG. 16 illustrates operation upon reading out of data 1 from the cells on the second word line SWLa<0> where the cell current is high and upon writing of data 1 into cells of another second word line SWLb<0> where the cell current is high.

Since the reading out operation in this instance is carried out similarly to the operation described hereinabove with reference to FIG. 14, operation upon writing of data 1 into the second word line SWLb<0> where the cell current is high is described.

In this instance, in the standby state, the precharge signal PREb is supplied in a high-level state.

As a result, the bit line BLb0 is retained at the ground potential GND, that is, in a reset state.

At this time, the read data enable signals or reading out activation signals RDE_A, RDE_B and RDE_C, write data enable signals or writing activation signals WDE_A, WDE_B and WDE_C, second word lines SWLa, SWLb and SWLc, first word line TWL and Y switch signals YSWa, YSWb and YSWC are set to the ground potential GND.

Then, when a writing mode is entered, the desired second word line SWLb<0>, first word line TWL0 and Y switch signal YSWb<0> rise to the high level. Meanwhile, the precharge signal PREb falls to the low level, and consequently, the bit line BLa0 enters a floating state from the ground potential GND.

Further, the Y switch signal YSWb<0> and the write data enable signal WDE_B rise from the low level to the high level to turn on the Y transfer gate switch TMGb0, whereupon the desired write driver WDRVb1 and bit line BLb0 are connected to each other through the second data transfer line DTLb1.

Figure 5A:
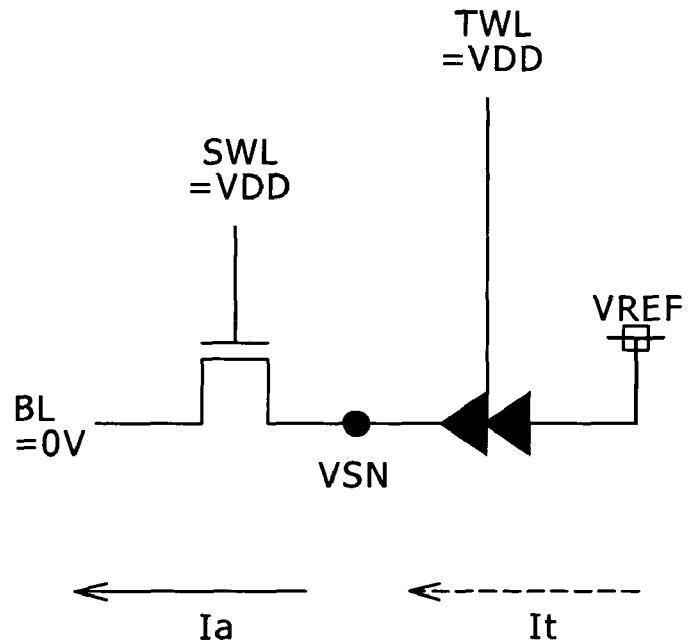
FIGS. 5A and 5B are a circuit diagram and a diagrammatic view, respectively, illustrating a potential state of the thyristor RAM cell upon writing operation of data "1"
Figure 5B:
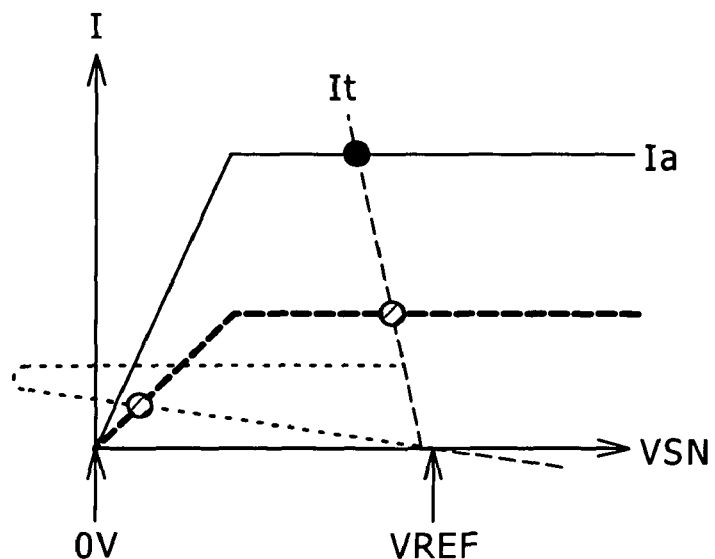
Figure 6A:
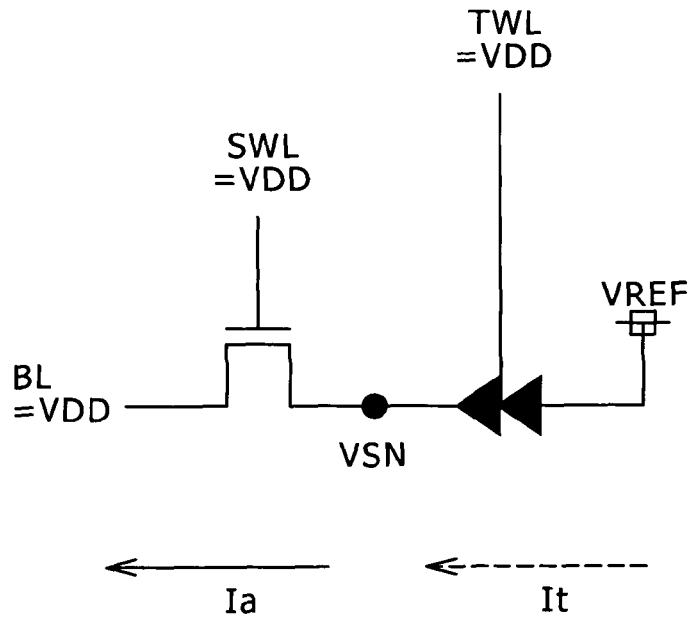
FIGS. 6A and 6B are a circuit diagram and a diagrammatic view, respectively, illustrating a potential state of the thyristor RAM cell upon writing operation of data "0"
Figure 6B:
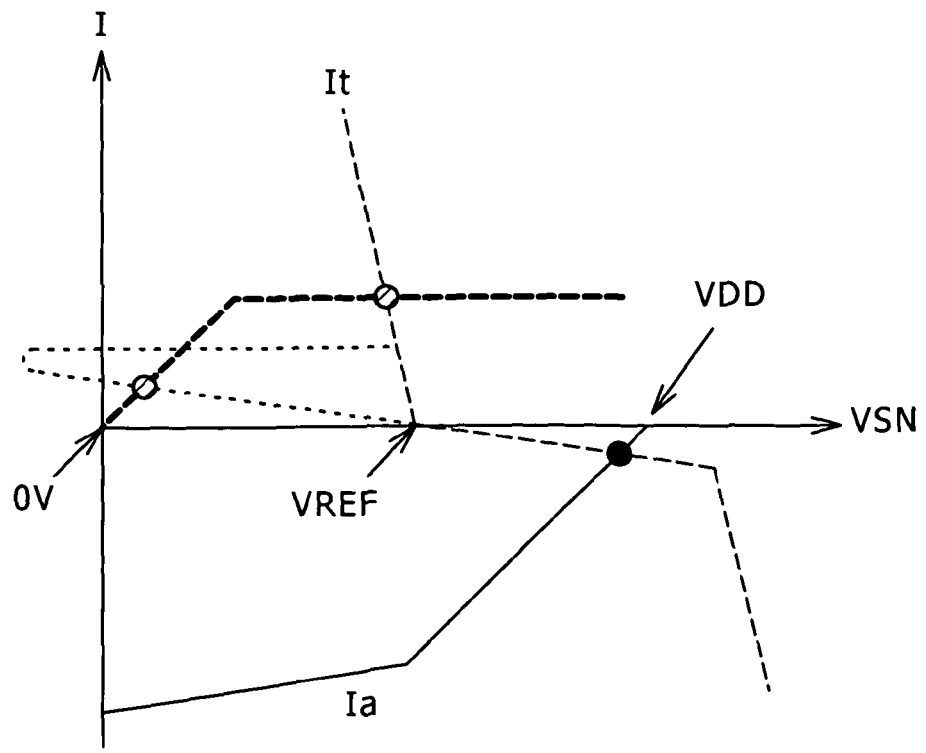
Figure 7A:
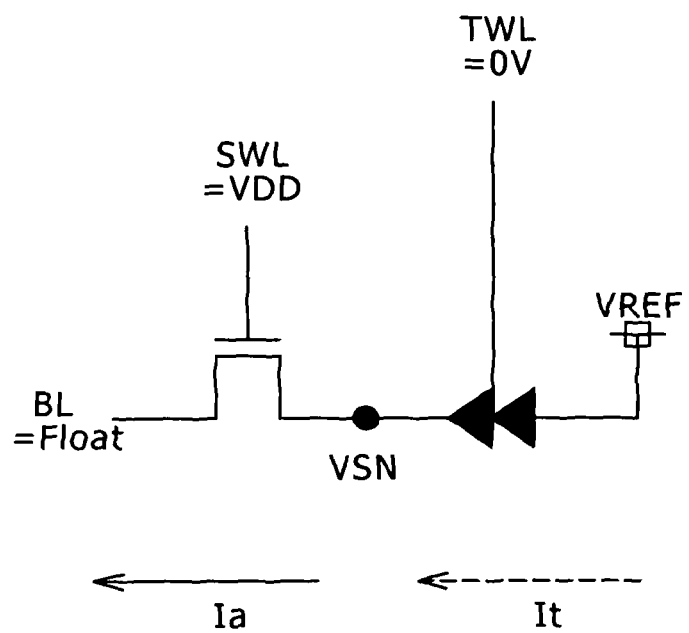
FIGS. 7A and 7B are a circuit diagram and a diagrammatic view, respectively, illustrating a cause of occurrence of disturb in the thyristor RAM cell upon reading out operation.
Figure 7B:
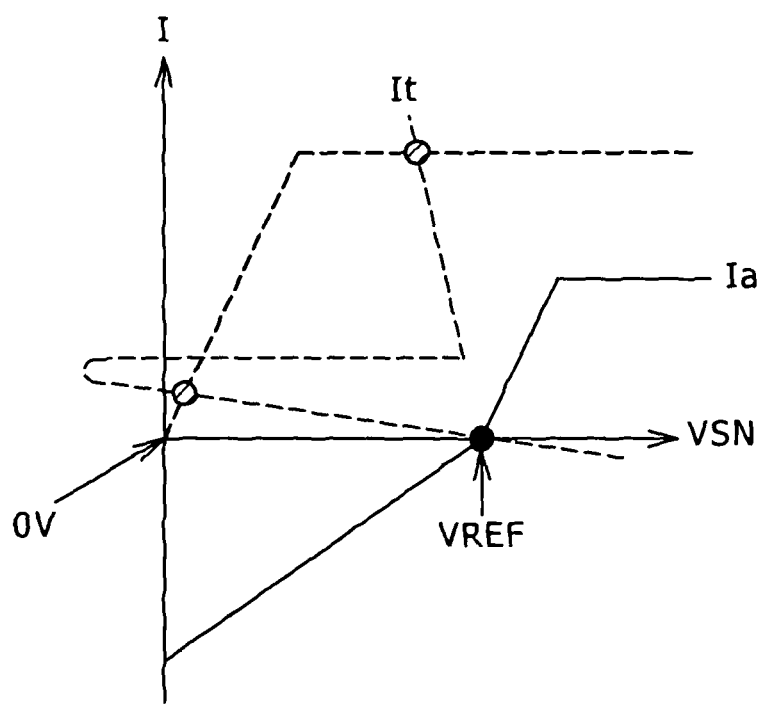

If the second word line SWLb<0> and the first word line TWL<0> are activated to the high level in a state wherein the bit line BLb0 is driven to 0 V by the write driver WDRVb1, then the stable point changes to the high cell current side as seen in FIG. 5 and the writing operation of the high data, that is, data 1, is completed.

As described above, with the present first embodiment, the thyristor RAM cell 111 includes a thyristor element 112 wherein a pnpn structure is formed on a semiconductor layer of a bulk-type semiconductor substrate, and access transistors 113, 114 and 115 formed on the semiconductor layer of the semiconductor substrate and connected to a storage node SN which is one terminal of the thyristor element 112. The gate of the thyristor element 112 and the gates of the access transistors 113, 114 and 115 are connected to different ones of word lines TWL, SWLa, SWLb and SWLc, and the access transistors 113, 114 and 115 are connected at terminals on one side thereof to the bit lines BLa, BLb and BLc to form a three-port RAM (1RW1RW1RW) configuration. Consequently, the thyristor RAM cell 111 can carry out multi-port operation.

Figure 17:
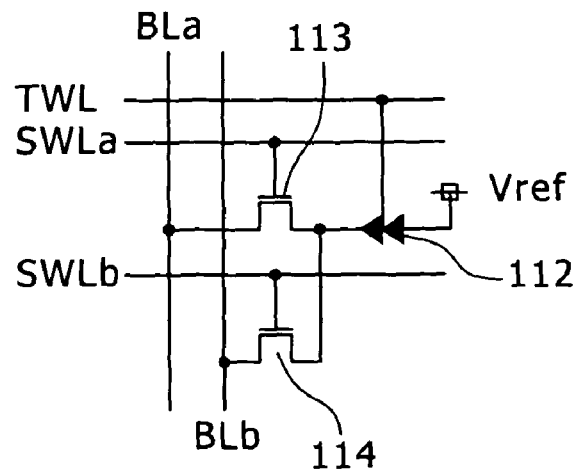
FIG. 17 is a circuit diagram showing an example of a two-port configuration of a thyristor RAM cell shown in FIG. 8.

It is to be noted that, while the first embodiment described above is described taking a 3-port thyristor RAM cell as an example, the present invention is not limited to this, but also it is possible to configure a 2-port or 4-port or more thyristor RAM cell as seen in FIG. 17.

FIG. 17 shows an example of a 2-port configuration of the 1RW1RW1RW type thyristor RAM cell of FIG. 8. Meanwhile, FIG. 18 shows thyristor RAM cells of FIG. 17 arrayed in two rows and two columns.

Figure 18:
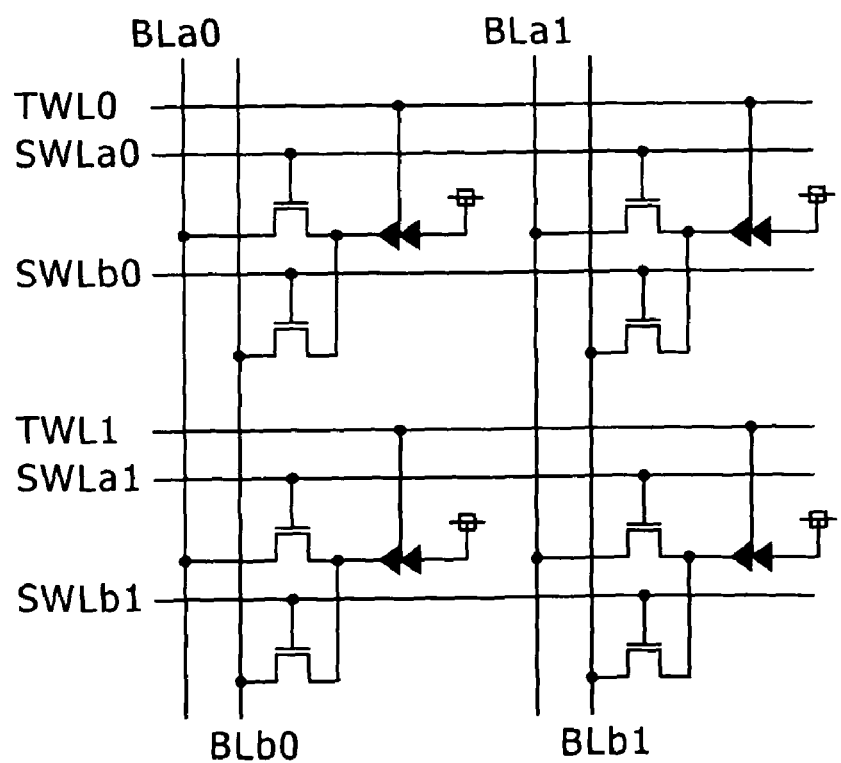
FIG. 18 is a circuit diagram showing thyristor RAM cells of FIG. 17 arrayed in two rows and two columns.

Referring to FIGS. 17 and 18, the thyristor RAM cell of the present example is formed as a 1RW1RW memory element including two access transistors 113 and 114 and one thyristor element.

Further, the configuration of the thyristor RAM cell is not limited to that of FIG. 8 or 17.

Figure 19:
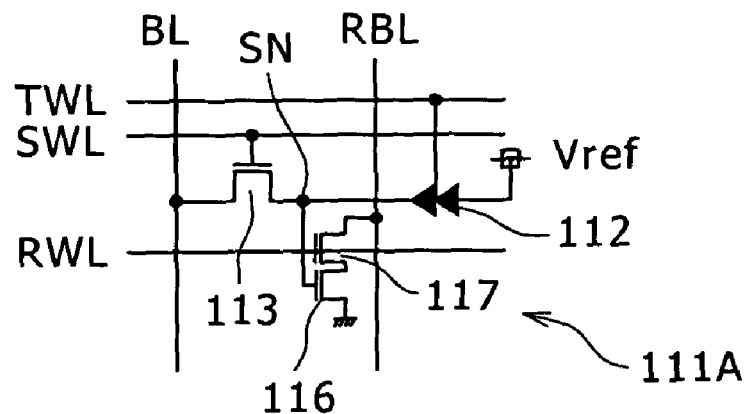
FIG. 19 is a circuit diagram showing an example of a configuration of a thyristor RAM cell of the 1RW1R type.
Figure 20:
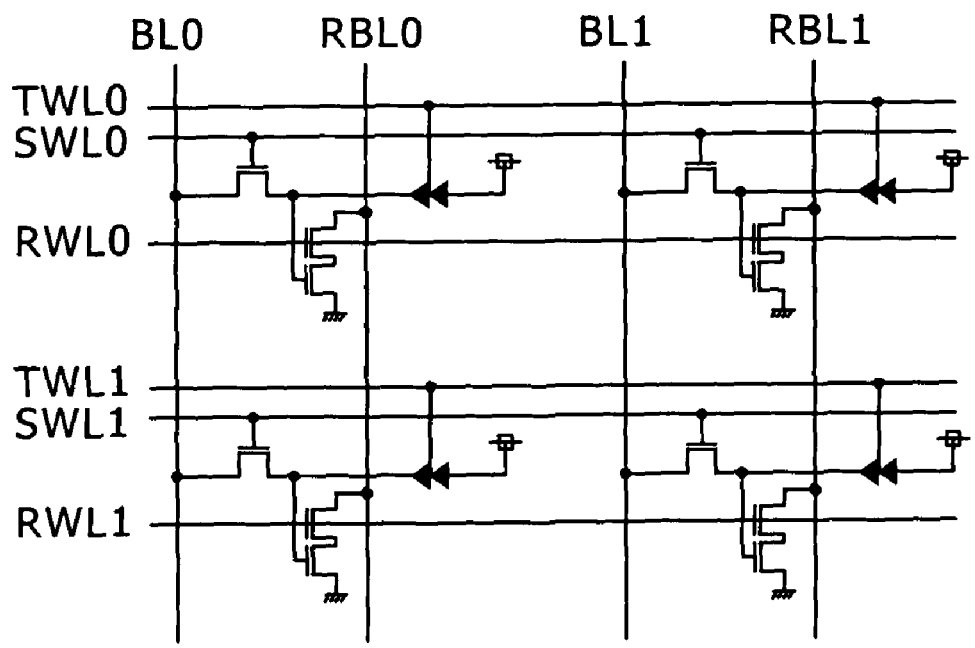
FIG. 20 is a circuit diagram showing two-port thyristor RAM cells of FIG. 19 arrayed in two rows and two columns.

FIG. 19 shows an example of a configuration of a 1RW1R type thyristor RAM cell. Meanwhile, FIG. 20 shows 2-port thyristor RAM cells of FIG. 19 arrayed in two rows and two columns, and FIG. 21 shows 3-port thyristor RAM cells of FIG. 19 arrayed in two rows and two columns.

Figure 21:
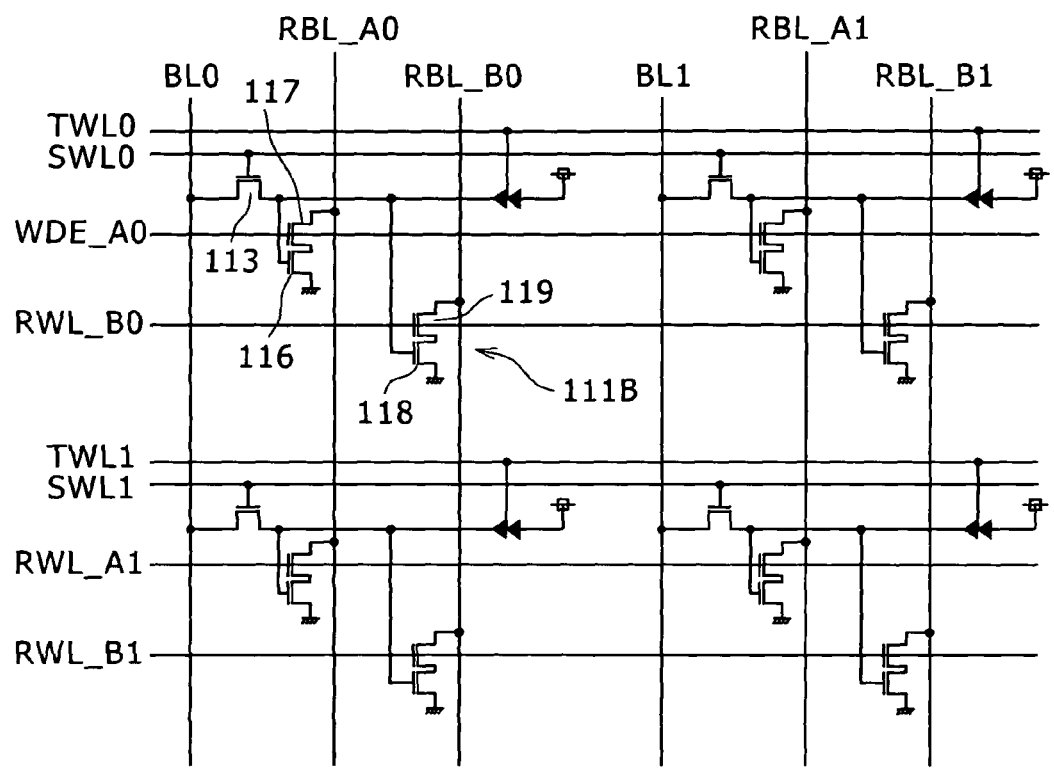
FIG. 21 is a circuit diagram showing thyristor RAM cells of FIG. 19 arrayed in two rows and two columns so as to have three ports.

Referring to FIGS. 19 and 21, the thyristor RAM cell 111A shown is basically formed from three access transistors 113, 116 and 117 and one thyristor element 112.

The access transistor 113 has a function basically same as that in the configuration of FIG. 8 or 17.

The access transistors 116 and 117 are connected in series between the ground potential GND and a bit line RBL. The access transistor 116 is connected at the source thereof to the ground potential GND, and the access transistor 117 is connected at the drain thereof to the bit line RBL.

Further, the access transistor 116 is connected at the gate thereof to the storage node SN, and the access transistor 117 is connected at the gate thereof to a word line RWL to implement a 1RW (Read/Write) 1R (Read) multi-port configuration.

The thyristor RAM cell 111A is different from the thyristor RAM cell of FIG. 8 or 17 in that a potential at the storage node SN is received at an NMOS gate to provide a gain.

It is to be noted that the MOS gate which provides a gain may be configured also from a PMOS gate. Further, although the source potential of the reading access transistor is to set to the ground potential GND level, also it is possible to set the source potential to any other potential.

Particularly where the potential at the storage node SN is received by a PMOS gate, the source potential is set to the power supply voltage VDD.

The effect of the present configuration is that a multi-port configuration can be implemented without increasing the influence of read disturb of the bit line RBL potential upon the thyristor RAM cell of FIG. 8 or 17. Upon reading out from a port connected to a bit line BL, the reading out is influenced by read disturb similarly as in the case of the array of FIG. 8 or 17. However, in a case wherein reading out from the same address or memory cell is carried out through a plurality of ports, the reading out does not undergo disturb by the bit line RBL potential, and therefore, the disturb to the same memory cell is reduced in comparison with that in the case of the array of FIG. 8 or 17.

FIG. 21 shows an example having a 1RW2R multi-port configuration with the number of ports increased further.

Referring to FIG. 21, the thyristor RAM cell 111B shown includes, in addition to the components of the thyristor RAM cell 111A of FIGS. 19 and 20, access transistors 118 and 119 and a bit line RBL.

The thyristor RAM cell 111B includes a bit line RBL_A0 to which the access transistors 116 and 117 are connected and a bit line RBL_B0 to which the access transistors 118 and 119 are connected.

The function of the thyristor RAM cell 111B is same as that of the thyristor RAM cell 111 and the thyristor RAM cell 111A described hereinabove.

It is to be noted that, while, in the thyristor RAM cell described above, a thyristor word line and an access transistor word line for controlling writing operation are provided separately from each other, the writing controlling word lines may be formed as a single common word line.

Figure 22:
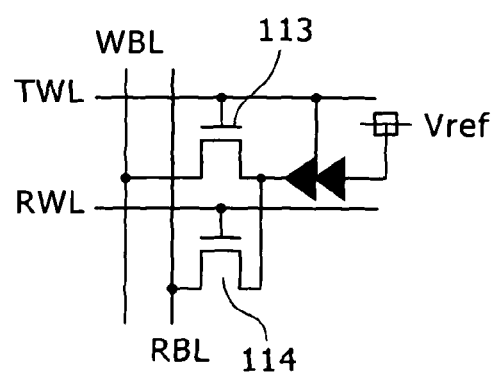
FIG. 22 is a circuit diagram showing an example of a configuration of the thyristor RAM cell of the 1RW1RW type shown in FIG. 17 wherein a write controlling word line is used commonly.
Figure 23:
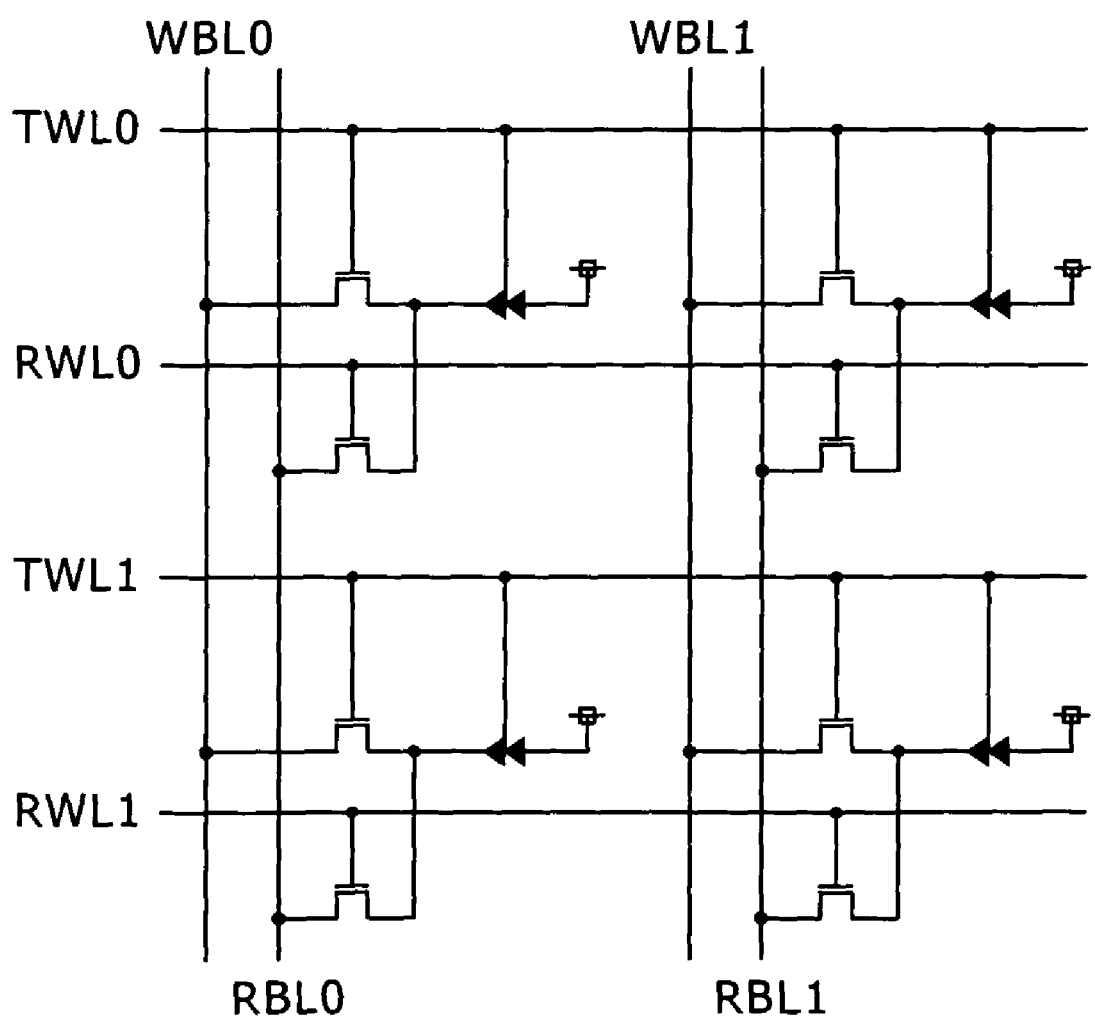
FIG. 23 is a circuit diagram showing thyristor 2-port RAM cells of FIG. 22 arrayed in two rows and two columns.
Figure 24:
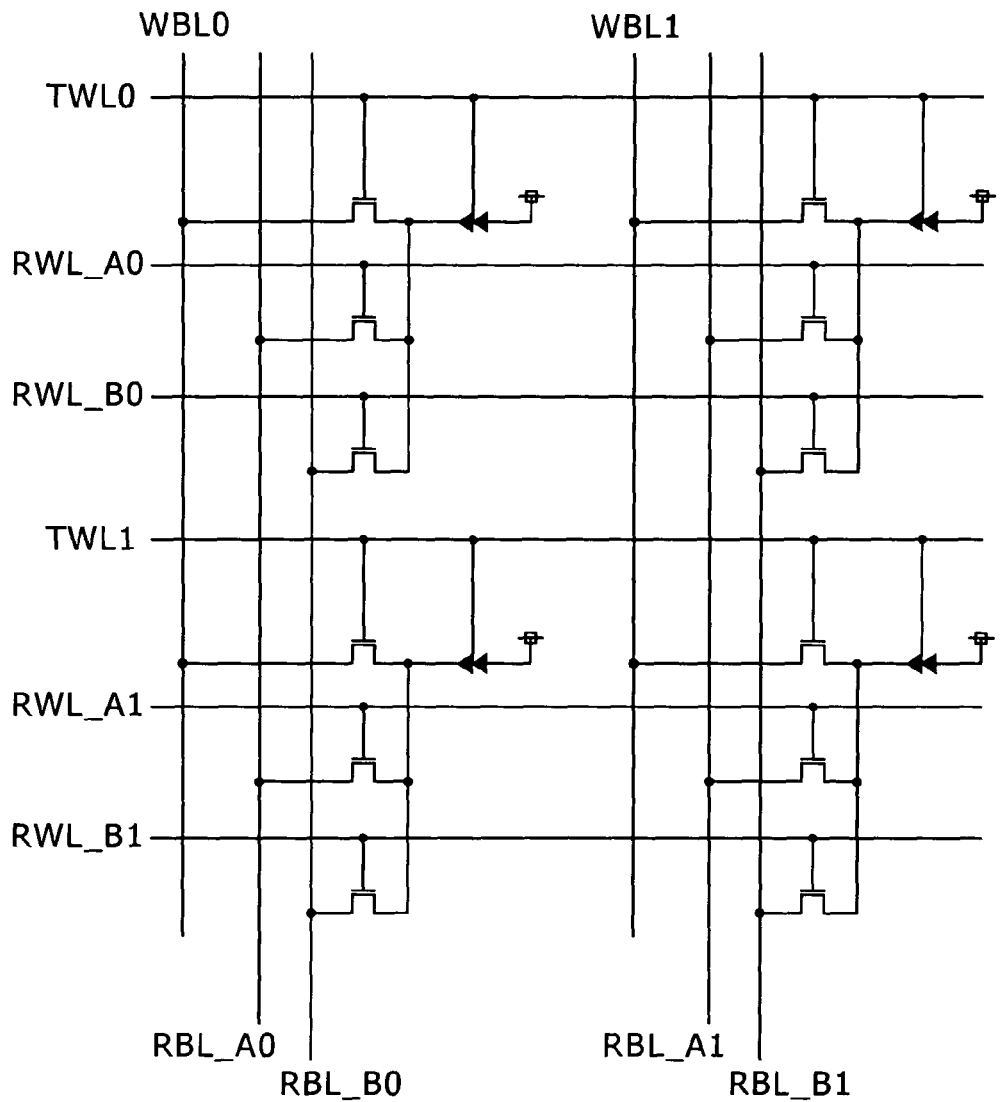
FIG. 24 is a circuit diagram showing thyristor RAM cells of FIG. 22 arrayed in two rows and two columns so as to have three ports.

FIG. 22 shows an example of a configuration wherein a single writing controlling word line is used commonly in the 1RW1RW type thyristor RAM cell of FIG. 17. Meanwhile, FIG. 23 shows 2-port thyristor RAM cells to FIG. 22 arrayed in two rows and two columns while FIG. 24 shows thyristor RAM cells of FIG. 22 arrayed in two rows and two columns so as to have three ports.

Figure 25:
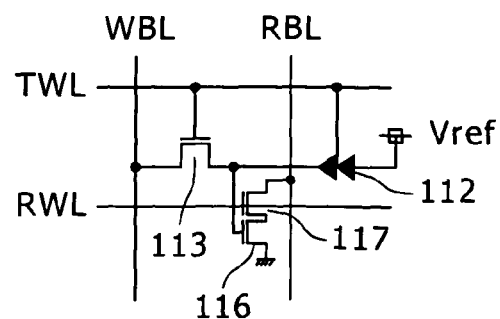
FIG. 25 is a circuit diagram showing an example of a configuration of the thyristor RAM cell of the 1RW1R type shown in FIG. 19 wherein a write controlling word line is used commonly.
Figure 26:
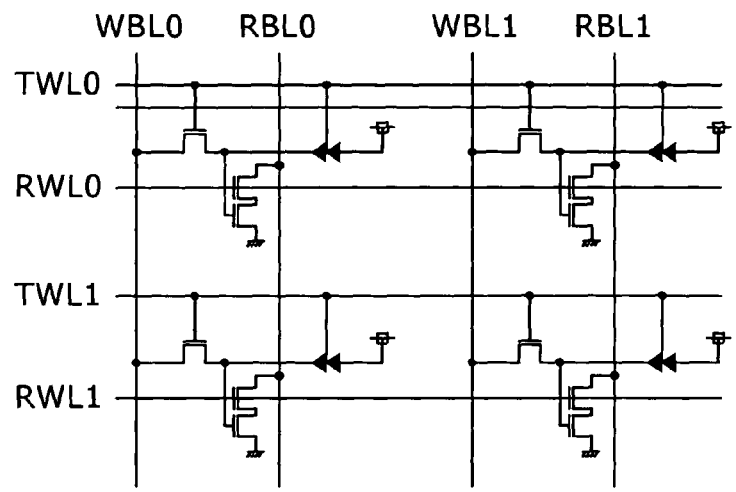
FIG. 26 is a circuit diagram showing 2-port thyristor RAM cells of FIG. 25 arrayed in two rows and two columns.

Similarly, FIG. 25 shows an example of a configuration wherein a single writing controlling word line is used commonly in the 1RW1R type thyristor RAM cell of FIG. 19. Meanwhile, FIG. 26 shows 2-port thyristor RAM cells of FIG. 25 arrayed in two rows and two columns while FIG. 27 shows thyristor RAM cells of FIG. 25 arrayed in two rows and two columns so as to have three ports.

By the present configuration, operation through the access transistor decreases from 1RW (Read/Write) operation to 1W (Write) operation. However, 1W1R-port operation can be achieved by addition of a reading access transistor.

The present configuration provides an effect of reduction of the cell size by merging of the first word line TWL and the word line SWL and permission of reduction of the decoder size by merging (WWL) of the first word line TWL and a SWL driving driver.

Figure 27:
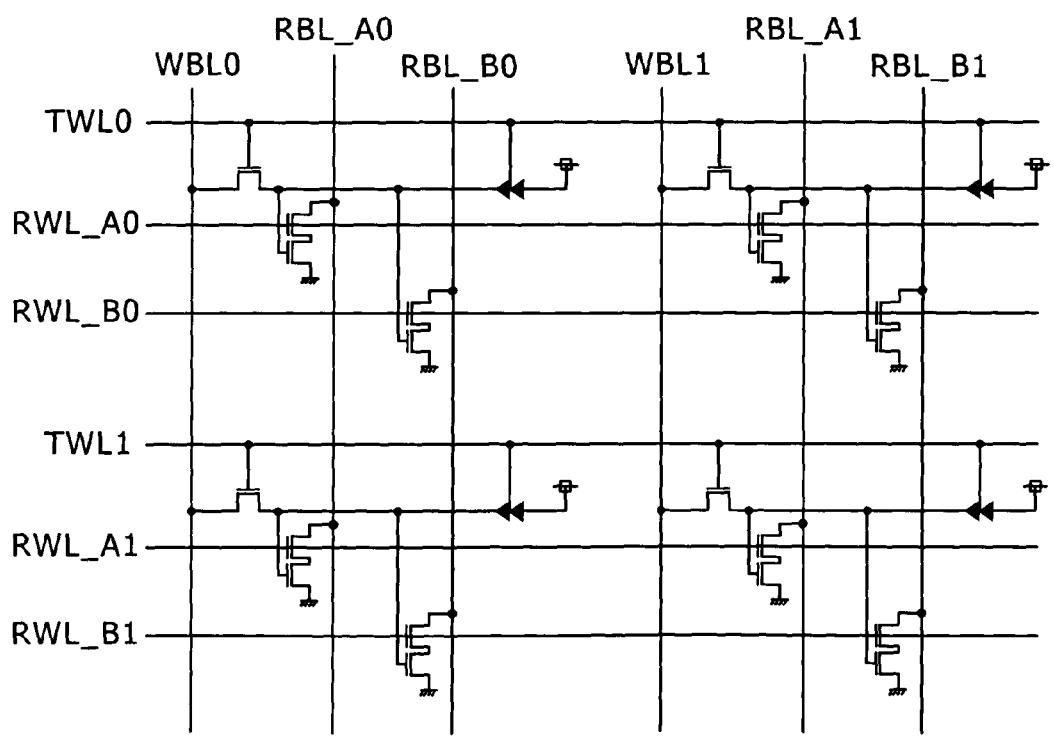
FIG. 27 is a circuit diagram showing thyristor RAM cells of FIG. 25 arrayed in two rows and two columns so as to have three ports.

In the following description, the semiconductor device 100A which adopts the memory array section of FIG. 27 is described as a second embodiment of the present invention.

Second Embodiment

Figure 28:
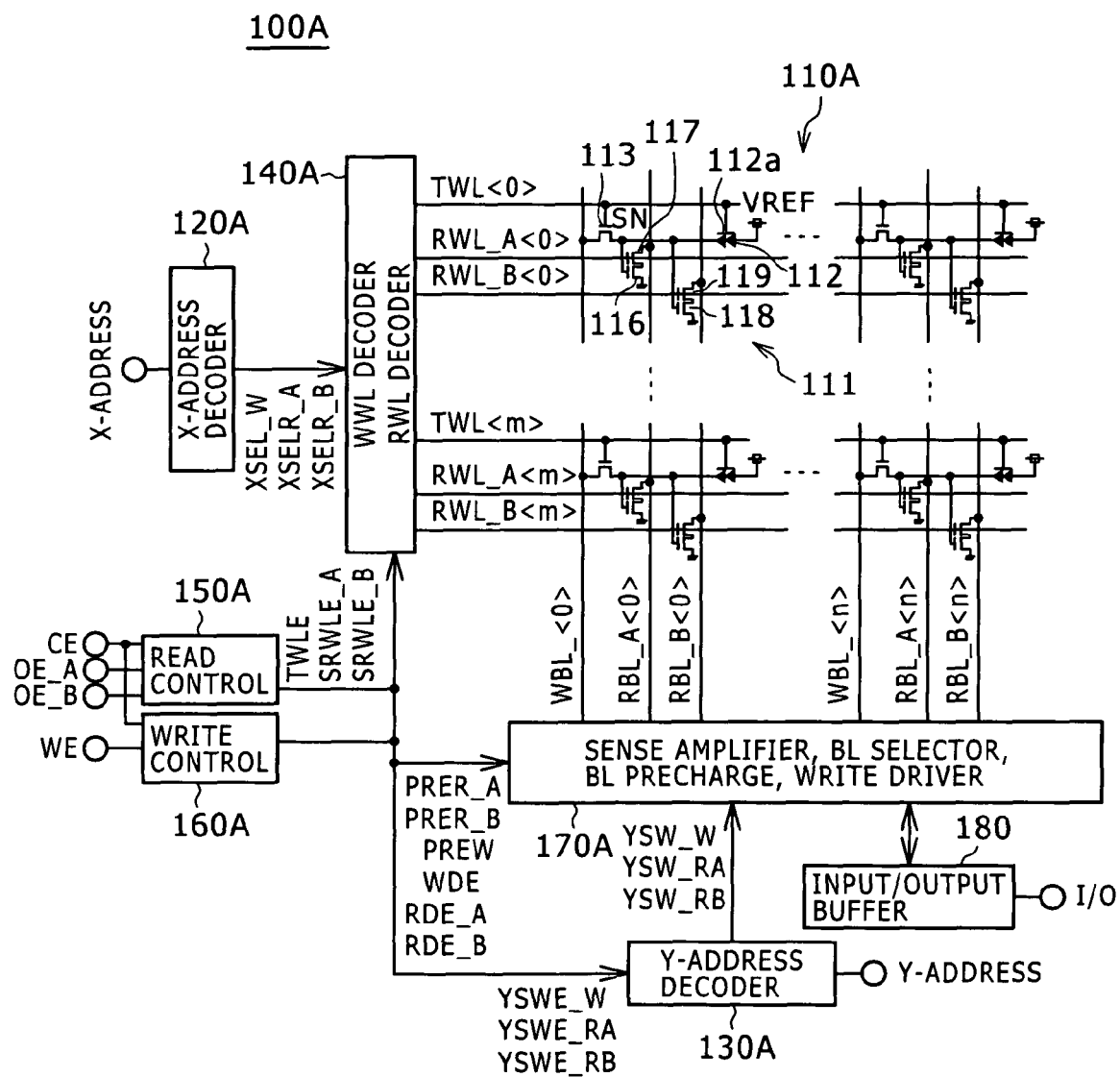
FIG. 28 is a block diagram showing a general configuration of another semiconductor device to which the present embodiment is applied.

FIG. 28 shows a general configuration of a semiconductor device according to a second embodiment of the present invention.

Referring to FIG. 28, the semiconductor device 100 includes a memory array section 110A, an X address decoder or low address decoder 120A, a Y address decoder or column address decoder 130A, a word line decoder 140A, a read control section 150A, a write control section 160A, a Y control section or column control section 170A, and an input/output buffer 180.

The word line decoder 140A, read control section 150A, write control section 160A, Y control section 170A and so forth cooperatively form a control section.

The memory array section 110A includes a plurality of thyristor RAM cells or memory cells 111 disposed in a matrix of m rows and n columns (m×n). It is to be noted that, in FIG. 28, the thyristor RAM cells 111 are shown disposed in a matrix of 2 rows and 2 columns for simplified illustration.

Each of the thyristor RAM cells 111 includes a thyristor element 112 with a gate having a pnpn structure formed on a semiconductor layer of a bulk-type semiconductor substrate, and access transistors 113, 116, 117, 118 and 119 formed on the semiconductor layer of the semiconductor substrate and connected to a storage node SN which is a first terminal of the thyristor element 112.

The thyristor RAM cells 111 in the present embodiment are formed as a 1W2RRAM.

In the memory array section 110A, first word lines TWL<0> to TWL<m> for thyristors and second word lines RWL_A<0> to RWL_A<m> and RWL_B<0> to RWL_B<m> for access transistors are wired for each row individually corresponding to row arrangements of the thyristor RAM cells 111.

Further, in the memory array section 110A, write bit lines WBL<0> to WBL<n>, first read bit lines RBL_A<0> to RBL_A<n> and second read bit lines RBL_B<0> to RBL_B<n> are wired for each column individually corresponding to column arrangements of the thyristor RAM cells 111 such that they extend perpendicularly to the first and second word lines.

Further, the gate electrodes 112a of the thyristor elements 112 and the gate electrodes of the access transistors 113 of the thyristor RAM cells 111 disposed on the same row are connected commonly to one of the first word lines TWL<0> to TWL<m> which is wired in the corresponding row.

Similarly, the gate electrodes of the access transistors 117 of the thyristor RAM cells 111 disposed on the same row are connected commonly to one of the second word lines RWL_A<0> to RWL_A<m> which is wired in the corresponding row.

The gate electrodes of the access transistors 119 of the thyristor RAM cells 111 disposed on the same row are connected commonly to one of the second word lines RWL_B<0> to RWL_B<m> which is wired in the corresponding row.

Further, diffusion layers or ones of source/drain regions of the access transistors 113 of the thyristor RAM cells 111 disposed on the same column are connected commonly to one of the write bit lines WBL<0> to WBL<n> which is wired in the corresponding column.

Similarly, diffusion layers or ones of source-drain regions of the access transistors 116 of the thyristor RAM cells 111 disposed on the same column are connected commonly to one of the first read bit lines RBL_A<0> to RBL_A<n> which is wired in the corresponding column.

Similarly, diffusion layers or ones of source-drain regions of the access transistors 119 of the thyristor RAM cells 111 disposed on the same column are connected commonly to one of the second read bit lines RBL_B<0> to RBL_B<n> which is wired in the corresponding column.

The access transistors 116 and 118 are connected at the gate thereof to the storage node SN.

Further, p-type anodes, which are reference potential terminals, of the thyristor elements 112 of the thyristor RAM cells 111 are connected to a reference voltage Vref. The value of the reference voltage Vref represents a voltage approximately one half that of the power supply voltage VDD and is, for example, 0.9 volts where the power supply voltage VDD is 1.8 V.

The X address decoder 120A receives X addresses X0, X1, . . . and renders X select signals XSEL0, XCEL1, XSELR_A, XSELR_B and XSELR_C, which designate word lines to be selected, active, for example, to the high level. Then, the X address decoder 120A outputs the X select signal to the word line decoder 140A.

The X address decoder 120A has a configuration similar to that described hereinabove with reference to FIG. 9.

The Y address decoder 130A receives Y addresses Y0, Y1, . . . and renders complementary Y switch signals YSW_W, YSW_RA and YSW_RB for selectively switching on Y switches to which bit lines are connected to be selected by a bit line selector active and inverted signals of the Y switch signals. Then, the Y address decoder 130A outputs the Y switch signals and the inverted signals to the Y control section 170A.

the Y address decoder 130A has a basic configuration similar to that described hereinabove with reference to FIG. 10.

Figure 29:
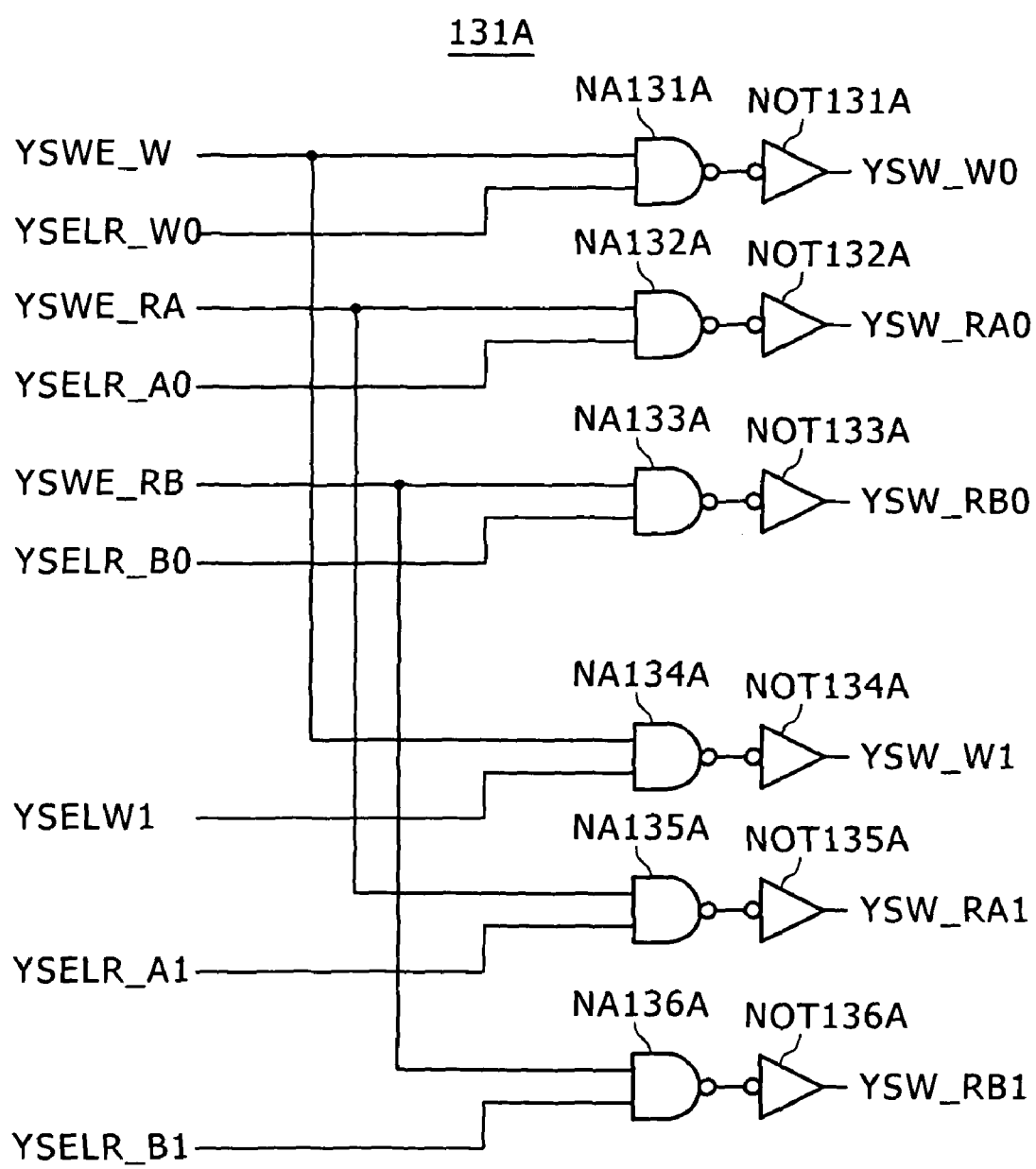
FIG. 29 is a circuit diagram showing an example of a configuration of a YSW decoder of a Y address decoder shown in FIG. 28.

FIG. 29 shows an example of a configuration of the YSW decoder in the Y address decoder in the present second embodiment.

Referring to FIG. 29, the YSW decoder 131A shown includes 2-input NAND circuits NA131A to NA136A and NOT circuits NOT131A to NOT136A.

A Y select signal Y_SEL_W0 produced by the YSW decoder 131A and a Y switch enable signal YSWE_W from the read control section 150A or the write control section 160A are inputted to a NAND circuit NA131A, and a result of NANDing by the NAND circuit NA131A is outputted as an activated Y switch signal YSW_W0 through the NOT circuit NOT131A.

A Y select signal Y_SELR_A0 produced by the YSW decoder 131A and a Y switch enable signal YSWE_RA from the read control section 150A or the write control section 160A are inputted to a NAND circuit NA132A, and a result of NANDing by the NAND circuit NA132A is outputted as an activated Y switch signal YSW_RA0 through the NOT circuit NOT132A.

A Y select signal Y_SELR_B0 produced by the YSW decoder 131A and a Y switch enable signal YSWE_RB from the read control section 150A or the write control section 160A are inputted to a NAND circuit NA133A, and a result of NANDing by the NAND circuit NA133A is outputted as an activated Y switch signal YSW_RB0 through the NOT circuit NOT133A.

A Y select signal Y_SEL_W1 produced by the YSW decoder 131A and a Y switch enable signal YSWE_W from the read control section 150A or the write control section 160A are inputted to a NAND circuit NA134A, and a result of NANDing by the NAND circuit NA134A is outputted as an activated Y switch signal YSW_W1 through the NOT circuit NOT134A.

A Y select signal Y_SELR_A1 produced by the YSW decoder 131A and a Y switch enable signal YSWE_RA from the read control section 150A or the write control section 160A are inputted to a NAND circuit NA135A, and a result of NANDing by the NAND circuit NA135A is outputted as an activated Y switch signal YSW RA1 through the NOT circuit NOT135A.

A Y select signal Y_SELR_B1 produced by the YSW decoder 131A and a Y switch enable signal YSWE_RB from the read control section 150A or the write control section 160A are inputted to a NAND circuit NA136A, and a result of NANDing by the NAND circuit NA136A is outputted as an activated Y switch signal YSW_RB1 through the NOT circuit NOT136A.

Only the Y switch signal YSW designated by the output Y_SEL of the YSW decoder 131A is activated by the signal YSEW. Upon reading out and upon writing, the Y switch signal YSW is activated separately for the ports.

The word line decoder 140A drives one of the first word line TWL and the word lines RWL_A and RWL_B designated by the X address in response to the X select signal X_SEL (XSELW, XSELR_A or XSELR_B) from the X address decoder 120A and the first word line enable signal TWLE and the second word line enable signals RWLE_A and RWLE_B from the read control section 150A or the write control section 160. In other words, the word line decoder 140A sets the first word line TWL and the word lines RWL_A and RWL_B to the high level.

It is to be noted that, upon reading out operation, the second word line enable signal RWLE is activated, but upon writing operation, both of the first word line enable signal TWLE and the second word line enable signal RWLE are activated.

The word line decoder 140A has a configuration basically same as that described hereinabove with reference to FIG. 12. Since the number of second word lines is two, the necessity for the NAND circuits NA144 and NA148 and the NOT circuits NOT144 and NOT148 is eliminated.

The read control section 150A receives a chip enable signal CE and output enable signals OE_A and OW_B from the outside to decide whether or not the current mode is a reading out mode.

If the read control section 150A decides that the current mode is a reading out mode, then it outputs the second word line enable signal RWLE (RWLE_or RWLE_B) in an active high-level state to the word line decoder 140A. Then, within a reading out period, the read control section 150A changes over the read precharge signal PRER (PRER_A or PRER_B) from the high level to the low level to set the write precharge signal PREW to the high level, the read data enable signal or reading out activation signal RDE (RDE_A or RDE_B) to the high level, the write data enable signal or writing activation signal WDE to the low level and the Y switch enable signal YSWE (YSWE_W, YSWE_RA or YSWE_RB) to the high level. Then, the read control section 150A outputs the write precharge signal PREW, read data enable signal RDE, write data enable signal WDE and Y switch enable signal YSWE to the Y control section 170A.

The write control section 160A receives a chip enable signal CE and a write enable signal WE from the outside to decide whether or not the current mode is a writing mode.

If the write control section 160A decides that the current mode is a writing mode, then it outputs the first word line enable signal TWLE and the second word line enable signal RWLE (RWLE_A or RWLE_B) in an active high-level state to the word line decoder 140A. Then, within a writing period, the write control section 160A changes over the write precharge signal PREW from the high level to the low level to set the read precharge signal PRER (PRER_A or PRER_B) to the low level, the write data enable signal WDE to the high level, the read data enable signal RDE (RDE_A or RDE_B) to the low level and the Y switch enable signal YSWE (YSWE_W, YSWE_RA or YSWE_RB) to the high level. Then, the write control section 160A outputs the read precharge signal PRER, write data enable signal WDE, read data enable signal RDE and Y switch enable signal YSWE to the Y control section 170A.

The Y control section 170A carries out precharge control of the write bit lines WBL<0> to WBL<n>, first read bit lines RBL_A<0> to RBL_A<n> and second read bit lines RBL_B<0> to RBL_B<n>, and voltage control of the write bit lines WBL<0> to WBL<n>, first read bit lines RBL_A<0> to RBL_A<n> and second read bit lines RBL_B<0> to RBL_B<n> upon writing operation and reading out operation. The Y control section 170A further carries out transfer control of write data to the write bit lines WBL<0> to WBL<n>, first read bit lines RBL_A<0> to RBL_A<n> and second read bit lines RBL_B<0> to RBL_B<n> and transfer control of read data to the sense amplifier SA including on/off control of the Y switch of the Y selector by the Y switch signal YSW.

As described above, the Y control section 170A has a sense amplifier for reading out operation, and the reading out control section of the Y control section 170A can be configured, for example, in such a manner as seen in FIG. 13.

Here, an example of a more particular configuration of the Y control section 170A is described.

Figure 30:
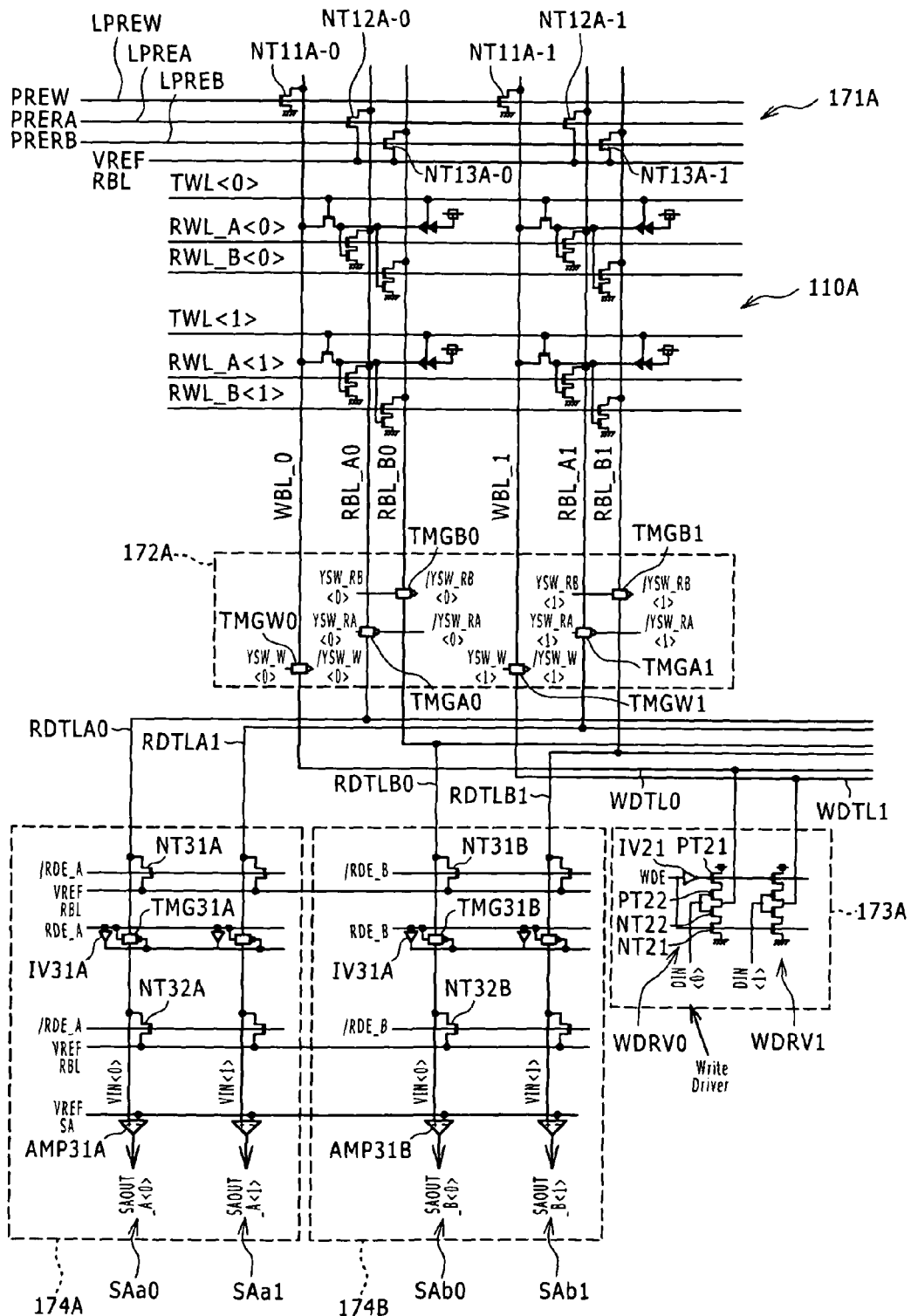
FIG. 30 is a circuit diagram showing an example of a configuration of a Y control section of the Y address decoder shown FIG. 28.

FIG. 30 shows an example of a configuration of the Y control section in the present second embodiment.

Referring to FIG. 30, the Y control section 170A includes a precharge circuit 171A, a Y selector 172A, a write driver group 173A, and sense amplifier (SA) groups 174A and 174B.

The precharge circuit 171A includes NMOS transistors NT11A-0 to NT11A-n, NMOS transistors NT12A-0 to NT12A-n, and NMOS transistors NT13A-0 to NT13A-n.

The NMOS transistors NT11A-0 to NT11A-n are connected at the source and the drain thereof to a ground potential GND and corresponding write bit lines WBL<0> to WBL<n>, respectively, and at the gate thereof commonly to a supply line LPREW for a write precharge signal PREW.

The NMOS transistors NT12A-0 to NT12A-n are connected at the source and the drain thereof to the ground potential GND and corresponding read bit lines RBL_A<0> to RBL_A<n>, respectively, and at the gate thereof commonly to a supply line LPREA for a precharge signal PREA.

The NMOS transistors NT13A-0 to NT13A-n are connected at the source and the drain thereof to the ground potential GND and corresponding second read bit lines RBL_B<0> to RBL_B<n>, respectively, and at the gate thereof commonly to a supply line LPREB for a precharge signal PREB.

The Y selector 172A includes first Y transfer gate switches TMGW0 to TMGWn for controlling connection between the write bit lines WBL0 to WBLn and write data transfer lines WDTL0 to WDTLn by the Y switch signal YSW_W and the inverted signal/YSW_W of the Y switch signal YSW_W produced in response to an address, second Y transfer gate switches TMGA0 to TMGAn for controlling connection between the read bit lines RBL_A0 to RBL_An and the read data transfer lines RDTLA0 and RDTLA2n by the Y switch signal YSW_RA and the inverted signal/YSW_RA of the Y switch signal YSW_RA produced in response to the address, and third Y transfer gate switches TMGB0 to TMGBn for controlling connection between the read bit lines RBL_B0 to RBL_Bn and the read data transfer lines RDTLB0 to RDTLBn by the Y switch signal YSW_RB and the inverted signal/YSW_RB of the Y switch signal YSW_RB produced in response to the address.

It is to be noted that the Y transfer gate switch is formed from an NMOS transistor and a PMOS transistor which are connected at the source and the drain thereof to each other.

The write driver group 173a includes a plurality of write drivers WDRV0 to WDRVn for transferring input data DIN<0> to DIN<n> to the first data transfer lines DTLa0 to DTLan, respectively.

The write drivers WDRV1 to WDRVn have a common configuration and are each formed as a clocked inverter which receives a write data enable signal WDE as a trigger.

Each write driver WDRV includes PMOS transistors PT21 and PT22, NMOS transistors NT21 and NT22 and an inverter IV21.

The PMOS transistor PT21 is connected at the source thereof to a supply line for the power supply voltage VDD and at the drain thereof to the source of the PMOS transistor PT22. The PMOS transistor PT22 is connected at the drain thereof to the drain of the NMOS transistor NT22, and the NMOS transistor NT22 is connected at the source thereof to the drain of the NMOS transistor NT21. The NMOS transistor NT21 is grounded at the source thereof. The inverter IV21 is connected at the input terminal thereof to a supply line for the write data enable signal WDE.

The PMOS transistors PT21 of the write drivers WDRV1 to WDRVn are connected commonly at the gate thereof to the output of the inverter IV21, and the NMOS transistors NT21 of the write drivers WDRV1 to WDRVn are connected commonly at the gate thereof to a supply line of the write data enable signal WDE.

The PMOS transistors PT22 and the NMOS transistors NT22 of the write drivers WDRV1 to WDRVn are connected at the gate thereof to input lines for input data DIN<0> to DIN<n>, respectively.

The sense amplifier group 174A has a plurality of sense amplifiers SAa0 to SAan for sensing and reading out read data transferred along the read data transfer lines RDTLa0 to RDTLan, respectively.

The sense amplifiers SAa0 to SAan have a common configuration and each includes an negative feedback amplifier AMP31A, a transfer gate TMG31A, NMOS transistors NT31A and NT32A and an inverter IV31A.

The transfer gate TMG31A is formed from an NMOS transistor and a PMOS transistor connected at the source and the drain thereof to each other, and is connected at an input and output terminal on one side thereof to the read data transfer lines RDTLA0 and RDTLA1 and one of the source/drain of the NMOS transistor NT31A. Meanwhile, the transfer gate TMG31A is connected at the other input and output terminal thereof to the non-negated input terminal (+) of the negative feedback amplifier AMP31A and one of the source/drain of the NMOS transistor NT32A.

The NMOS transistor of the transfer gate TMG31A is connected at the gate thereof to a supply line for the read data enable signal RDE_A, and the PMOS transistor of the transfer gate TMG31A is connected at the gate thereof to the supply line for the read data enable signal RDE_A through the inverter IV31A.

The transfer gate TMG31A is placed into an on state, that is, into a conducting state, in response to the read data enable signal RDE_A supplied thereto in an active state.

The negative feedback amplifier AMP31A is connected at the negated input terminal (−) thereof to a supply line for a reference voltage VREFSA.

The NMOS transistor NT31A is connected at the other one of the source/drain thereof to the ground potential GND and is connected to a supply line for the inverted signal /RDE_A of the read data enable signal RDE_A.

The NMOS transistor NT32A is connected at the other one of the source/drain thereof to the ground potential GND and is connected to the supply line for the inverted signal /RDE_A of the read data enable signal RDE_A.

The sense amplifier group 174B includes a plurality of sense amplifiers SAb0 to SAbn for sensing and reading out read data transferred through the read data transfer lines RDTLB0 to RDTLBn, respectively.

The sense amplifiers SAb0 to SAbn have a common configuration and each includes a negative feedback amplifier AMP31B, a transfer gate TMG31B, NMOS transistors NT31B and NT32B and an inverter IV31B.

The transfer gate TMG31B is formed from an NMOS transistor and a PMOS transistor connected at the source and the drain thereof to each other, and is connected at an input and output terminal on one side thereof to the read data transfer lines RDTLB0 and RDTLB1 and one of the source/drain of the NMOS transistor NT31B. Meanwhile, the transfer gate TMG31B is connected at the other input and output terminal thereof to the non-negated input terminal (+) of the negative feedback amplifier AMP31Bb and one of the source/drain of the NMOS transistor NT32B.

The NMOS transistor of the transfer gate TMG31B is connected at the gate thereof to a supply line for the read data enable signal RDE_B, and the PMOS transistor of the transfer gate TMG31B is connected at the gate thereof to the supply line for the read data enable signal RDE_B through the inverter IV31B.

The transfer gate TMG31B is placed into an on state, that is, into a conducting state, in response to the read data enable signal RDE_B supplied thereto in an active state.

The negative feedback amplifier AMP31B is connected at the negated input terminal (−) thereof to a supply line for the reference voltage VREFSA.

The NMOS transistor NT31B is connected at the other one of the source/drain thereof to the ground potential GND and is connected to a supply line for the inverted signal /RDE_B of the read data enable signal RDE_B.

The NMOS transistor NT32B is connected at the other one of the source/drain thereof to the ground potential GND and is connected to the supply line for the inverted signal /RDE_B of the read data enable signal RDE_B.

Now, operation of the semiconductor device having the configuration described above is described principally with regard to operation of the Y control section 170A with reference to FIGS. 31 to 36.

First, reading out operation of memory cell data is described.

Figure 31:
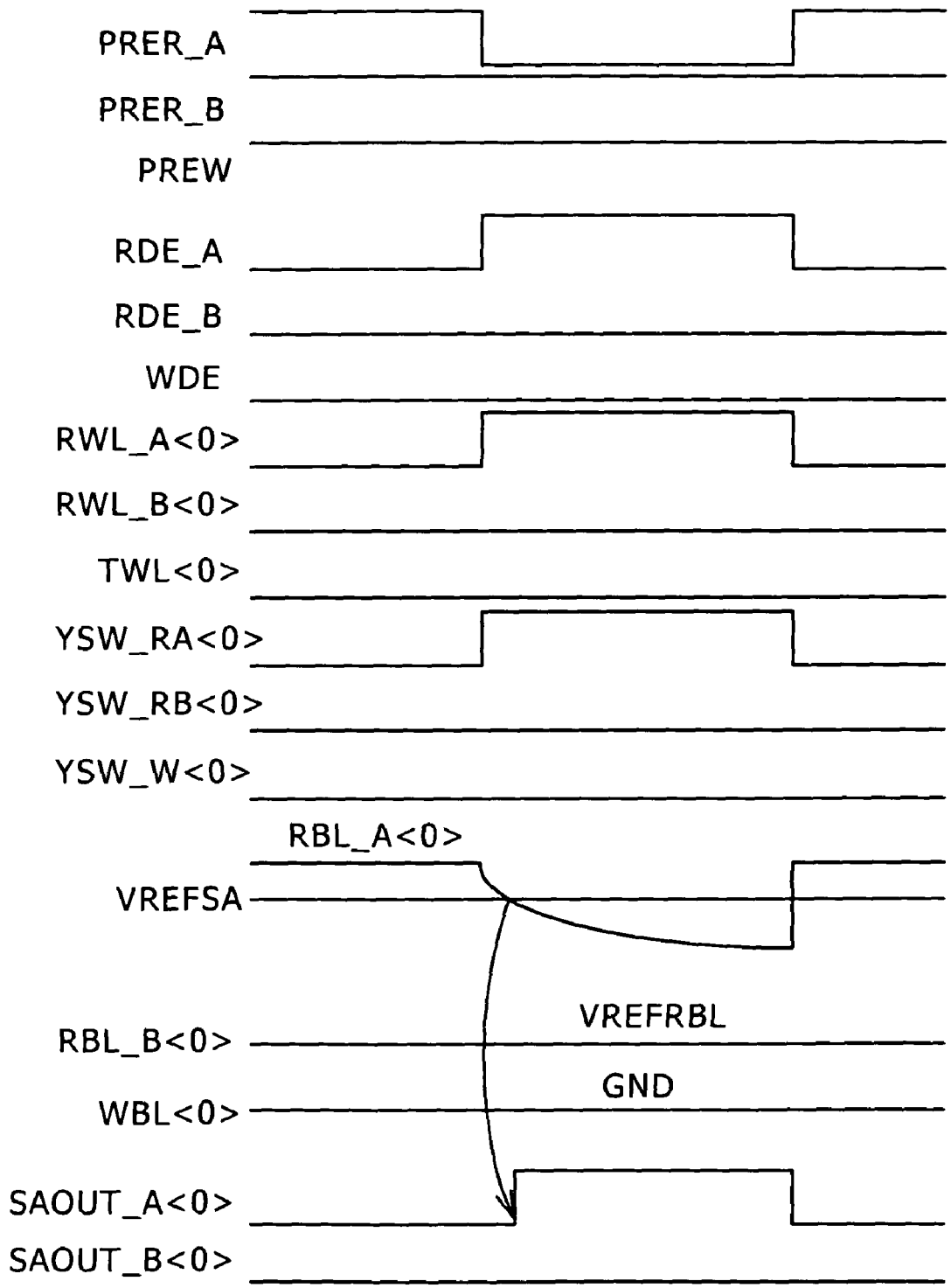
FIG. 31 is a waveform diagram illustrating operation of the semiconductor device of FIG. 28 upon reading out of data from cells on a second word line where the data is 1 and cell current is high.

FIG. 31 illustrates operation upon reading out of data 1 from cells of the second word line RWL_A<0> where the cell current is high.

In this instance, in the standby state, the precharge signal PREA is supplied in a high level state, and as a result, the bit line RBL_A0 is held at the ground potential GND or is in a reset state.

At this time, the read data enable signals or reading out activation signals RDE_A and RDE_B, write data enable signal or writing activation signal WDE, second word lines RWL_A and RWL_B, first word line TWL and Y switch signals YSW_RA, YSW_RB and YSW_W are set to the ground potential GND.

Then, when a reading out mode is entered, the desired second word line RWL_A<0> rises to the high level and the cell current of the thyristor RAM cell 111 is placed into an on state, that is, cell current flows through the thyristor RAM cell 111.

Further, the precharge signal PREA falls from the high level, that is, the power supply voltage level, to the low level, that is, to the ground potential level. Consequently, the bit line RBL_A<0> enters a floating state from the ground potential GND.

Further, the desired Y switch signal YSW_RA<0> and the read data enable signal RDE_A rise to the high level to turn on the transfer gate TMG31A, whereupon the sense amplifier SA and the bit line RBL_A0 are connected to each other through the data transfer line RDTLA0.

Since, upon reading out of high data, that is, data 1, the cell current is high, the bit line RBL_A0 is gradually charged from the ground potential GND by the cell. Here, if the potential at the bit line RBL_A0 becomes higher than the reference voltage VREFSA, then the sense amplifier SA makes a decision of 1 and changes the output SAOUT to the high level.

Figure 32:
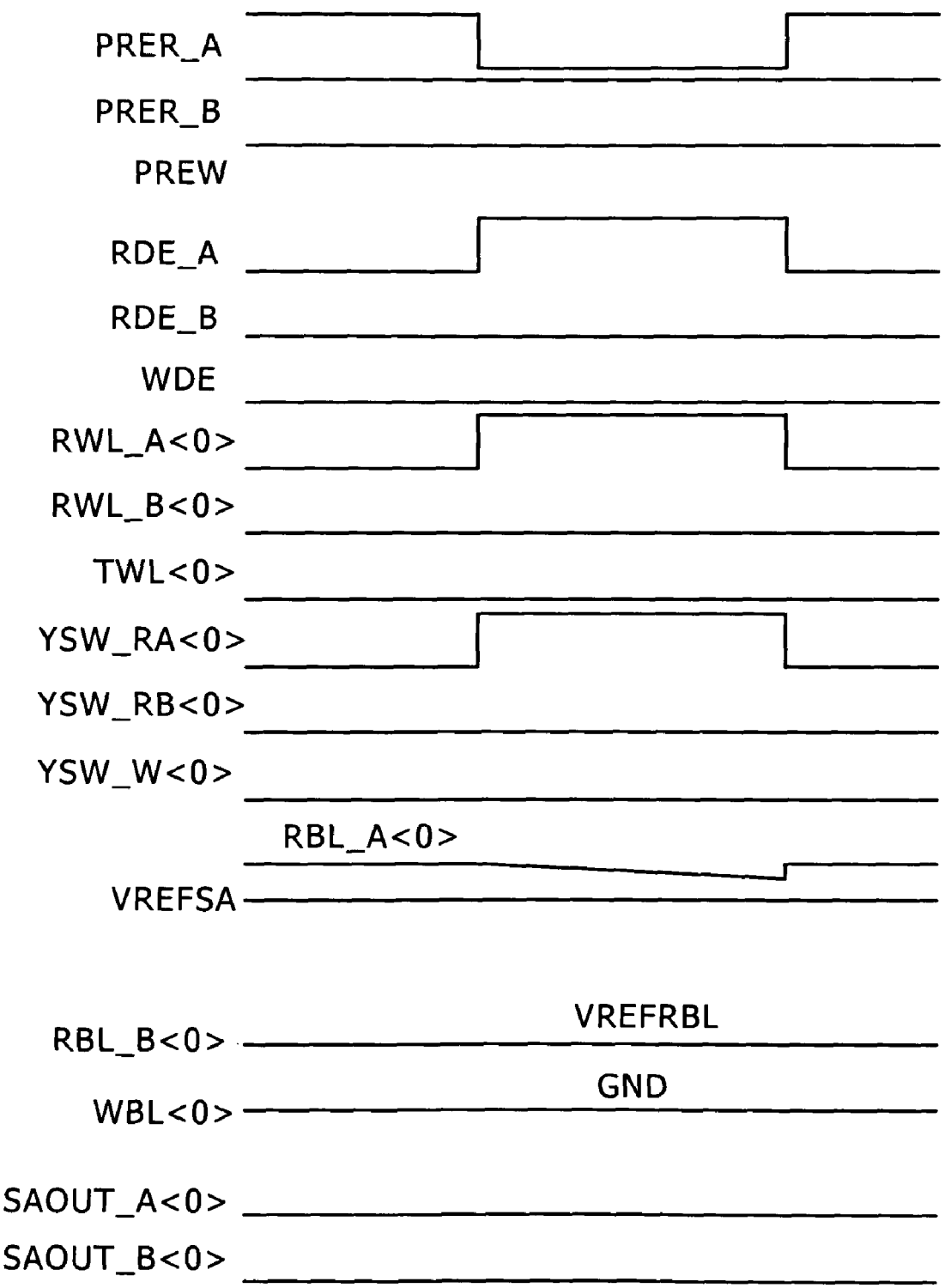
FIG. 32 is a similar view but illustrating operation of the semiconductor device of FIG. 28 upon reading out of data from the cells on the second word line where the data is 0 and cell current is low.

FIG. 32 illustrates operation of reading out of data 0 from the cells on the second word line RWL_A<0> where the cell current is low.

In this instance, although the operation is basically same as that described hereinabove with reference to FIG. 31, since the cell current is low, the charge amount of the bit line BLa0 is small. Therefore, the sense amplifier SA makes a decision of 0.

Figure 33:
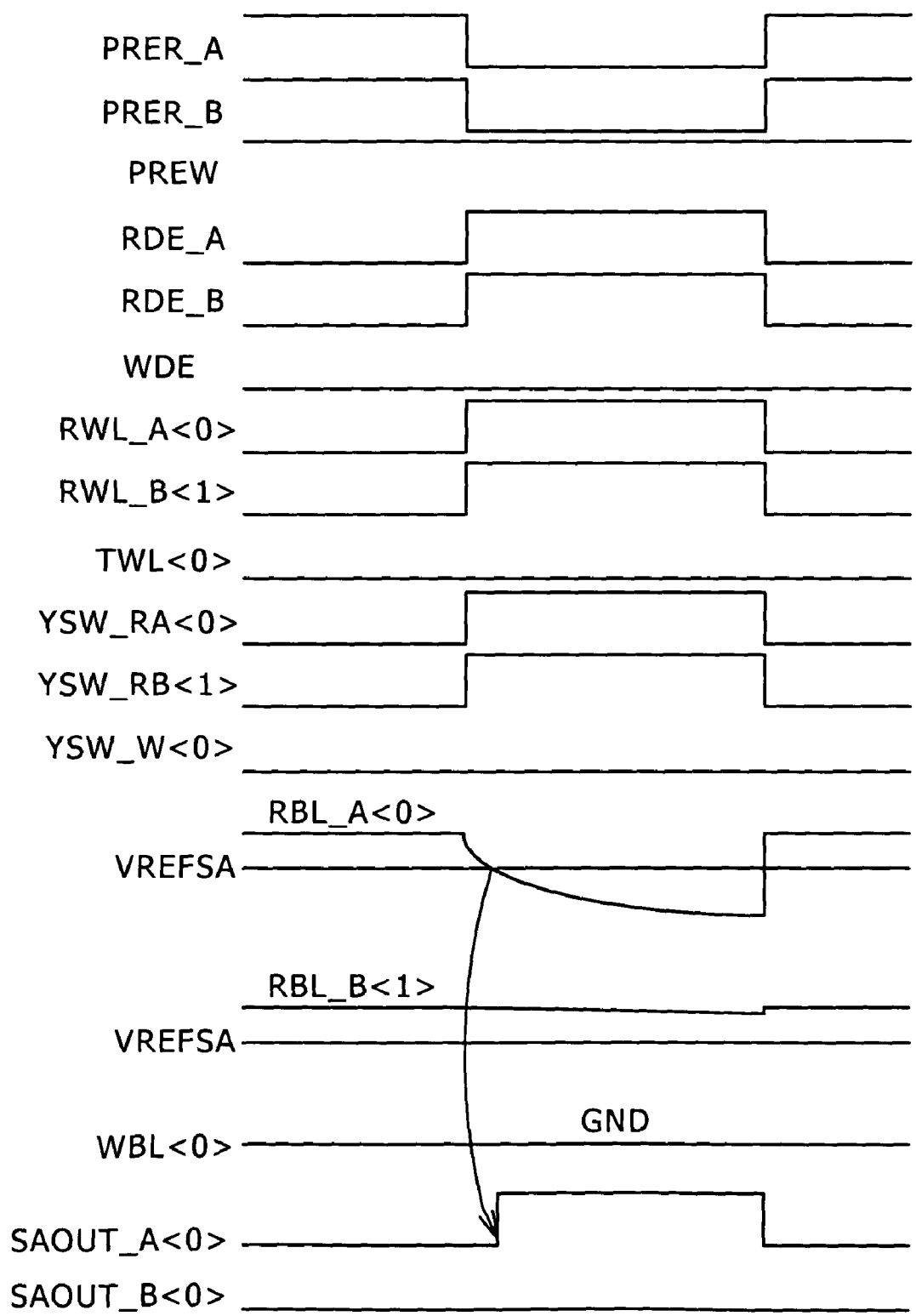
FIG. 33 is a similar view but illustrating operation of the semiconductor device of FIG. 28 upon reading out of data from the cells on the second word line where the data is 1 and cell current is high and reading out of data from cells on another second word line where the data is 1 and cell current is high.

FIG. 33 illustrates operation upon reading out of data 1 from the cells on the second word line RWL_A<0> where the cell current is high and upon reading out of data 0 from cells of another second word line RWL_B<0> where the cell current is low.

In this instance, since the different reading circuits are controlled independently of each other, they do not interfere with each other and multi-port operation is possible.

Now, writing operation of data into a memory cell is described.

Figure 34:
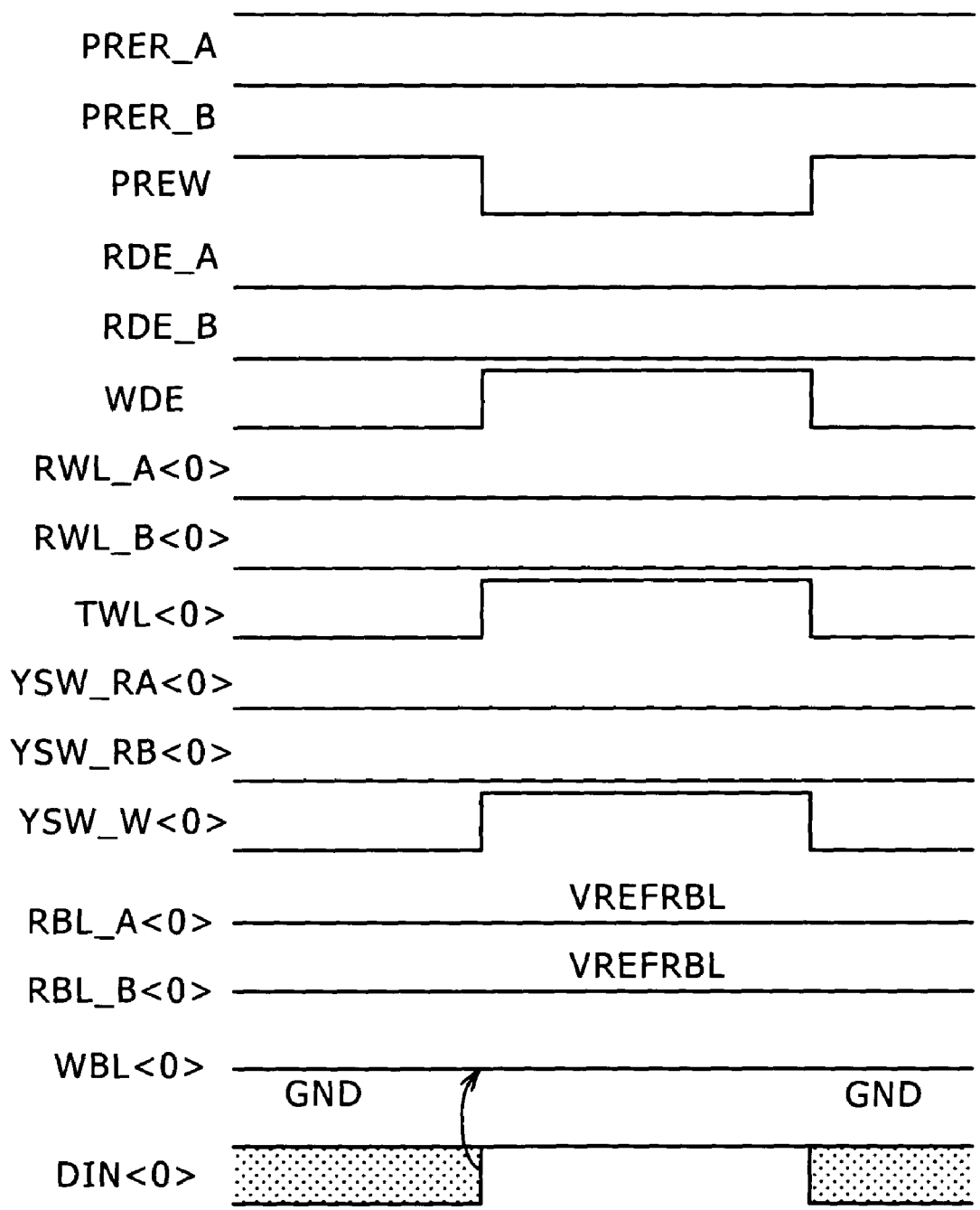
FIG. 34 is a waveform diagram illustrating operation of writing data into cells on a word line when the data is 1 and cell current is high.

FIG. 34 illustrates operation upon writing of data 1 into cells of a word line TWL where the cell current is high.

In this instance, in the standby state, the write precharge signal PREW is supplied in a high-level state.

As a result, the bit line WBL0 is retained at the ground potential GND, that is, is in a reset state.

At this time, the read data enable signals or reading out activation signals RDE_A, RDE_B and RDE_C, write data enable signal or writing activation signal WDE, second word lines RWL_A and RLW_B, first word line TWL and Y switch signals YSW_RA, YSW_RB and YSW_W are set to the ground potential GND.

Then, when a writing mode is entered, the desired word line TWL<0> and Y switch signal YSW_W<0> rise to the high level. Meanwhile, the write precharge signal PREW falls to the low level, and consequently, the bit line WBL0 enters a floating state from the ground potential GND.

Further, the desired Y switch signal YSW_W<0> and the write data enable signal WDE rise from the low level to the high level to turn on the Y transfer gate switch TMGW0, whereupon the desired write driver WDRV0 and bit line WBL0 are connected to each other through the write data transfer line WDTL0.

If the word line TWL<0> is activated to the high level in a state wherein the bit line WBL0 is driven to 0 V by the write driver WDRV0, then the stable point changes to the high cell current side as seen in FIG. 5 and the writing operation of the high data, that is, data 1, is completed.

Figure 35:
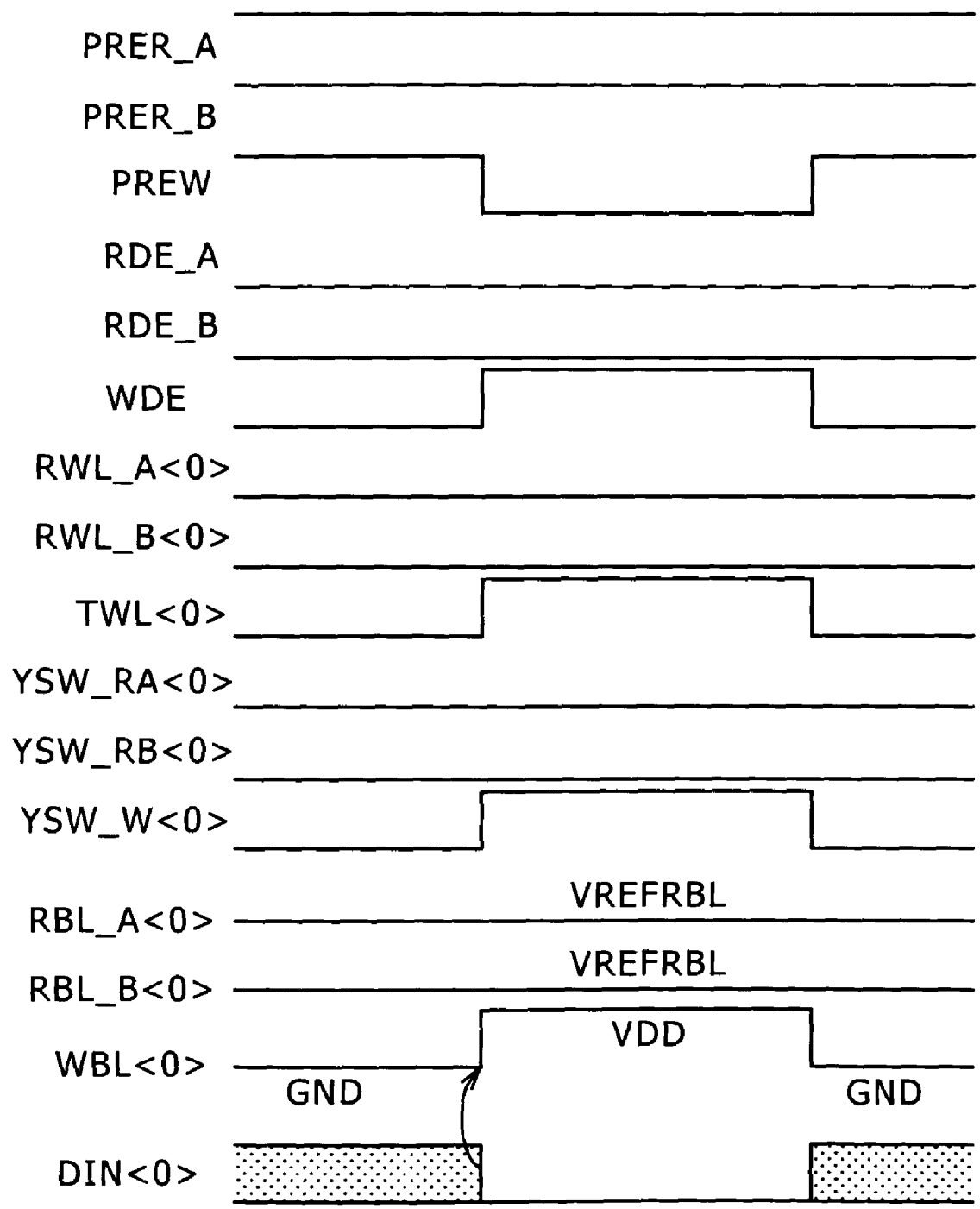
FIG. 35 is a similar view but illustrating operation of writing data into the cells on the word line when the data is 0 and cell current is low.

FIG. 35 illustrates operation upon writing of data 0 into cells of a word line TWL where the cell current is low.

In this instance, the operation is basically same as that described hereinabove with reference to FIG. 34.

Figure 36:
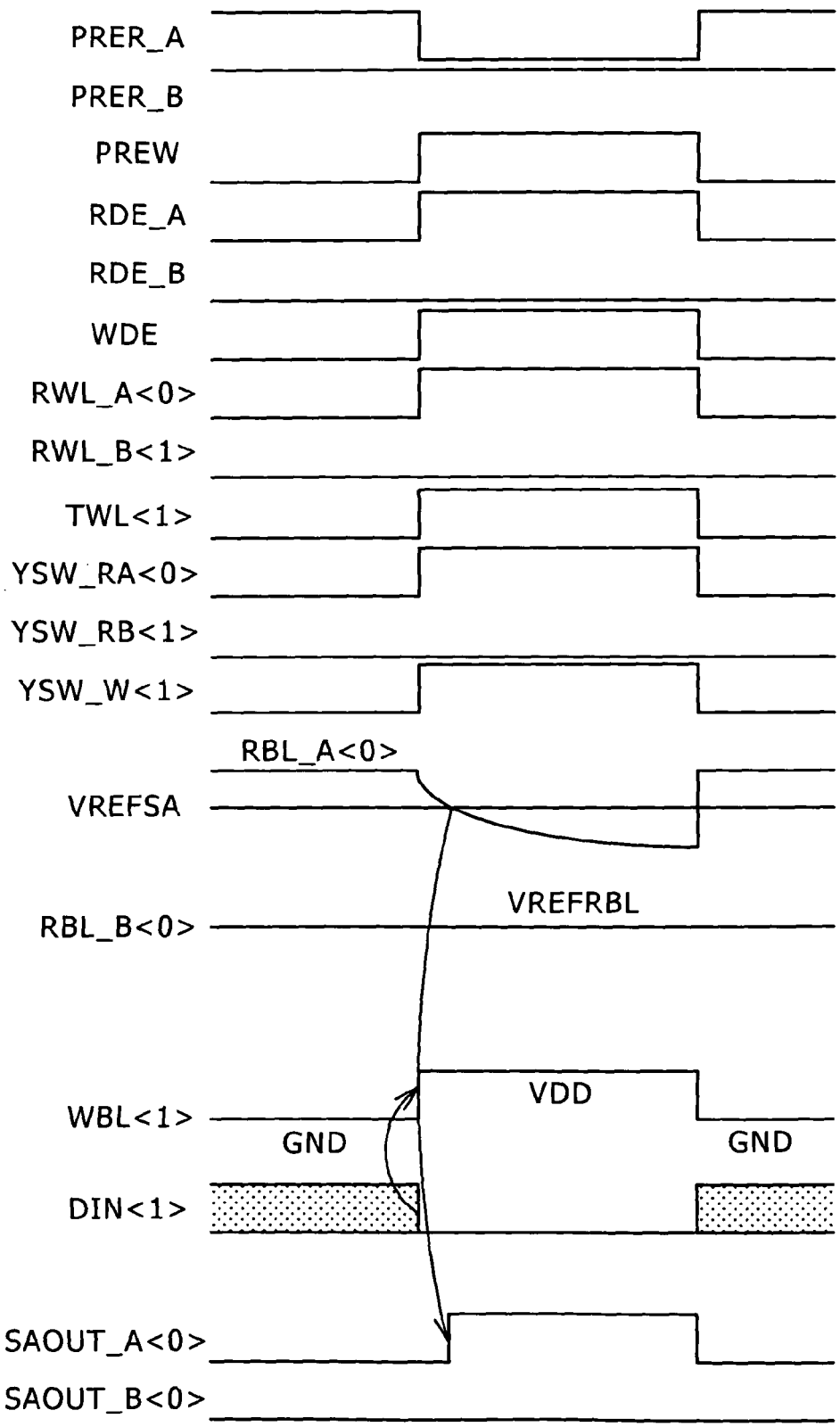
FIG. 36 is a waveform diagram illustrating operation of the semiconductor device of FIG. 28 upon reading out of data from cells on a second word line where the data is 1 and cell current is high and writing of data into cells on another second word line where the data is 1 and cell current is high.

FIG. 36 illustrates operation upon reading out of data 1 from the cells on the second word line RWL_A<0> where the cell current is high and upon writing of data 1 into cells of another word line TWL<1> where the cell current is high.

In this instance, since the different writing circuits are controlled independently of each other, they do not interfere with each other and multi-port reading and writing operation is possible.

Various thyristor RAM cells which can carry out multi-port operation according to the present embodiment are described above.

Equivalent circuits and examples of a layout pattern of popular thyristor RAM cells and the thyristor RAM cells according to the present embodiment are shown in FIGS. 37 to 40.

Figure 39:
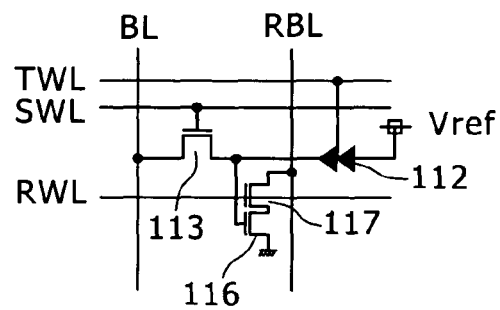
FIG. 39 is a circuit diagram and a schematic view showing an equivalent circuit of another thyristor RAM cell used in the semiconductor device of FIG. 28 and a second example of a layout pattern, respectively.
Figure 39:
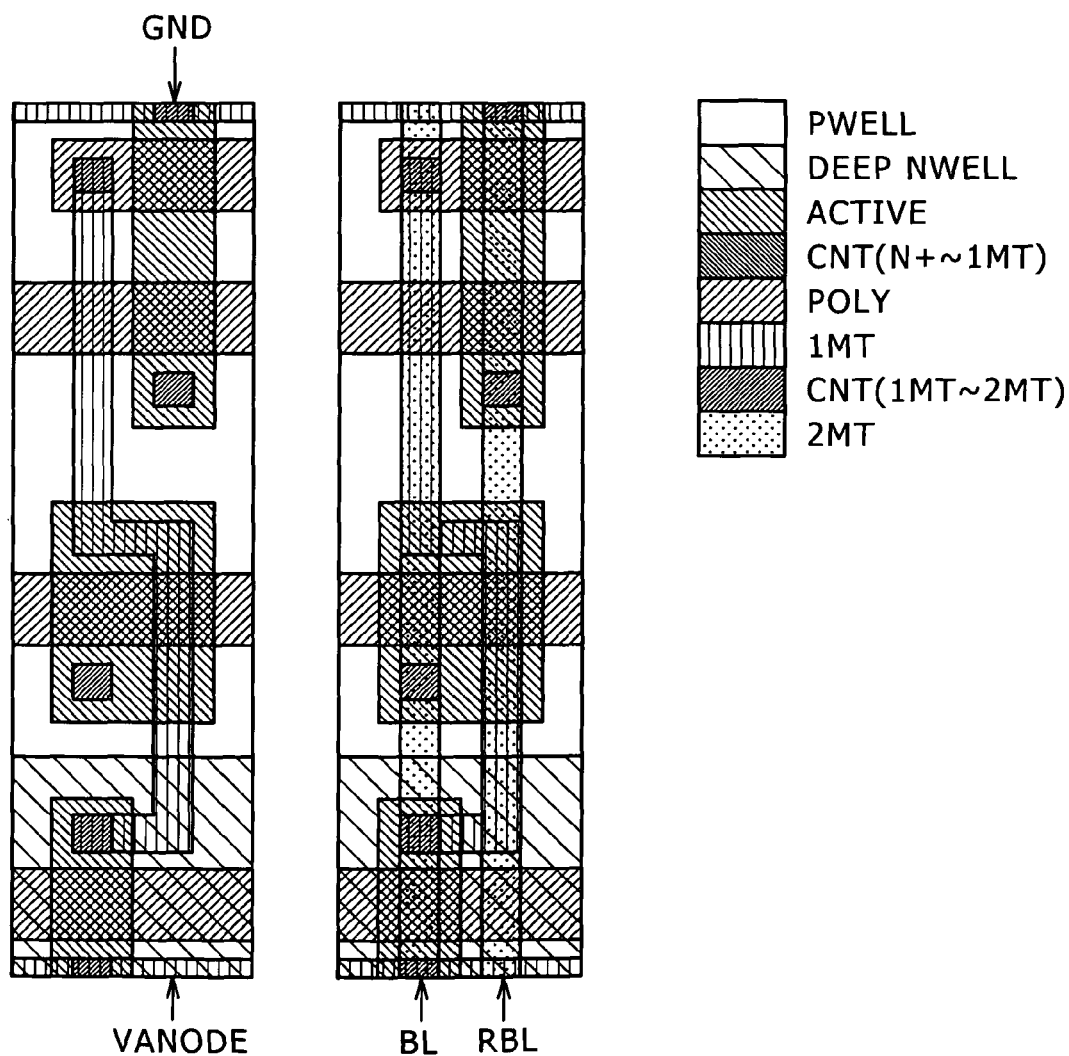
Figure 40:
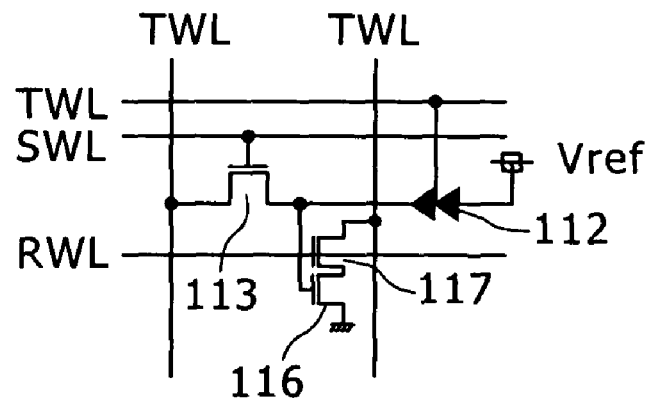
FIG. 40 is a circuit diagram and a schematic view showing an equivalent circuit of a further thyristor RAM cell used in the semiconductor device of FIG. 28 and a third example of a layout pattern, respectively.
Figure 40:
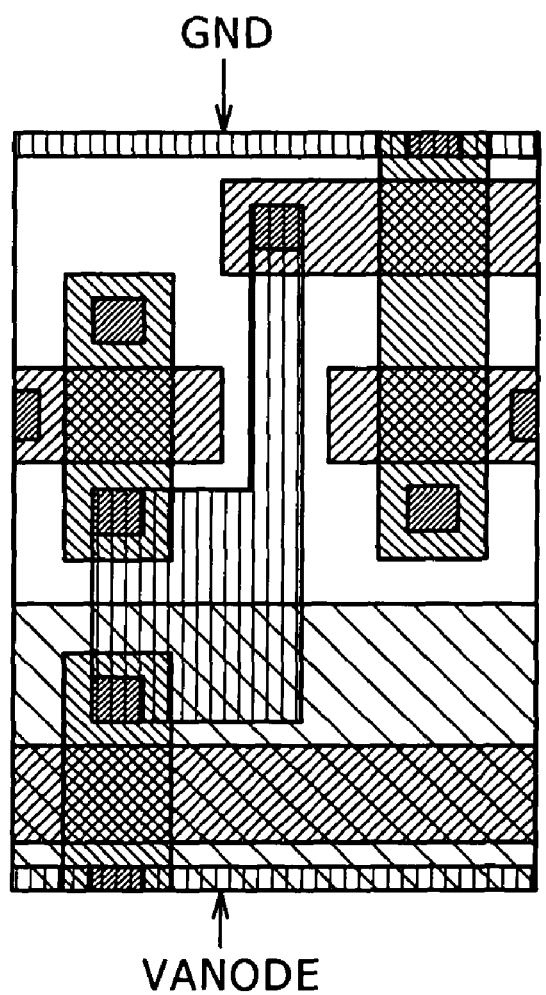

FIGS. 39 and 40 show different layout patterns of the same circuit.

Figure 37:
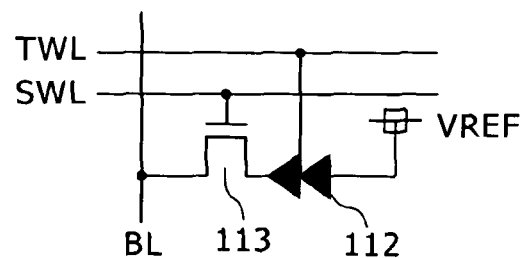
FIG. 37 is a circuit diagram and a schematic view showing an equivalent circuit of a popular thyristor RAM cell and an example of a layout pattern, respectively.
Figure 37:
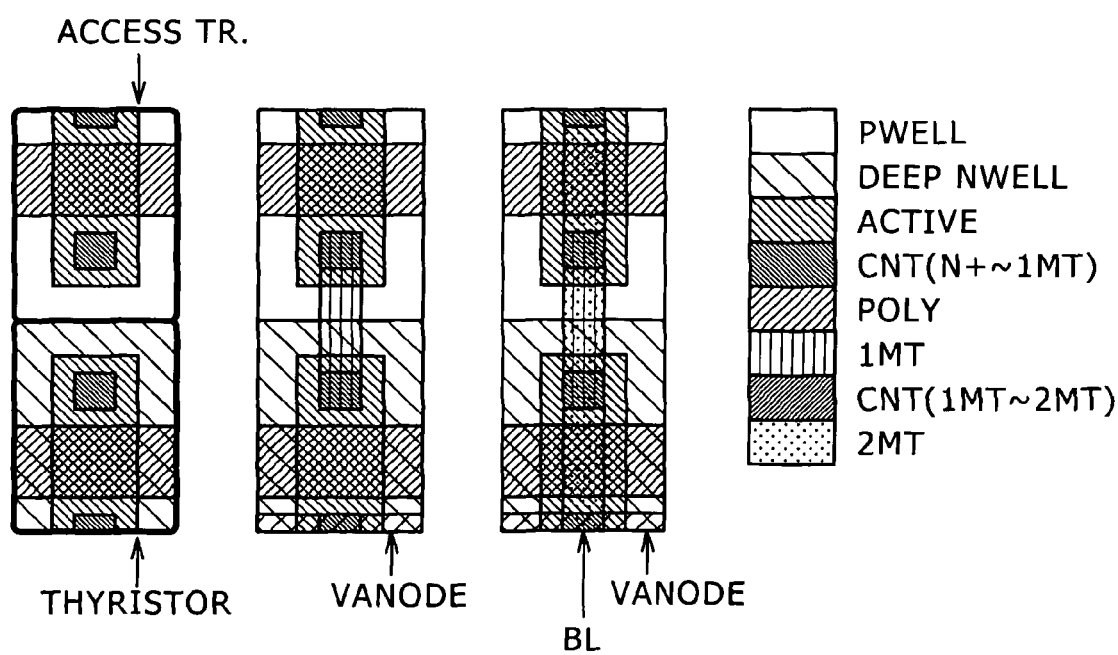
Figure 38:
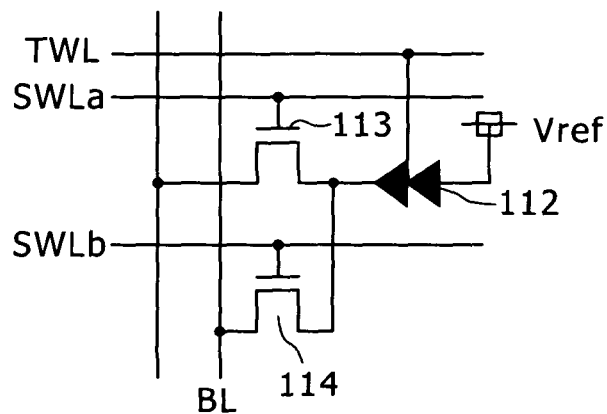
FIG. 38 is a circuit diagram and a schematic view showing an equivalent circuit of a thyristor RAM cell used in the semiconductor device of FIG. 28 and a first example of a layout pattern, respectively.
Figure 38:
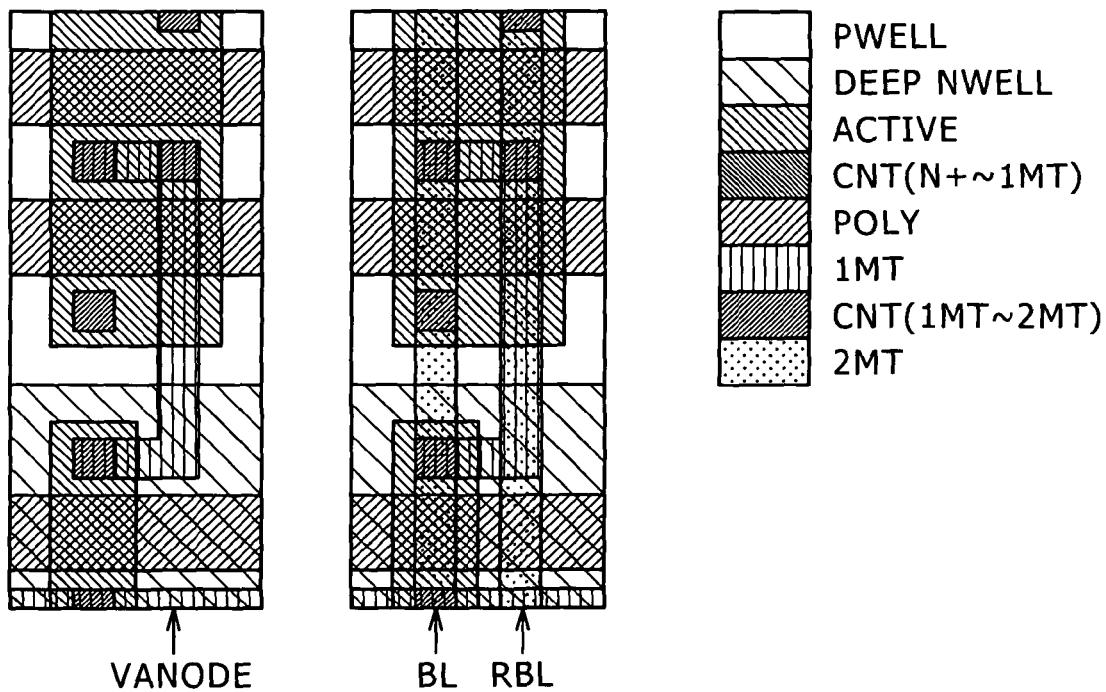

The thyristor RAM cell according to the present embodiment includes a number of access transistors increased from that of the popular thyristor RAM cell shown in FIG. 37. However, the circuit size can be reduced by device of the layout.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising
a memory cell including a thyristor element with a gate having a pnpn structure formed in a semiconductor substrate, and a plurality of access transistors formed on said semiconductor substrate and each connected at a first terminal thereof to a storage node at one terminal of said thyristor element the storage node being connected to a source-drain of each of the plurality of access transistors such that a potential at said storage node can be transmitted to bit lines different from each other,
the gate of said thyristor element and the gates of said plurality of access transistors of said memory cell being connected to word lines different from one another.

2. The semiconductor device according to claim 1, wherein said access transistors are connected between the corresponding bit lines and said storage node.

3. The semiconductor device according to claim 2, wherein a word line decoder is used commonly as the word line decoder to which one of said plurality of access transistors is connected and is connected to the gate of said thyristor element.

4. The semiconductor device according to claim 3, wherein
a plurality of memory cells including said memory cell are arrayed in a matrix, and
a plurality of bit lines including said bit lines are wired corresponding to the columns of the matrix array while a plurality of word lines including said word lines are wired corresponding to the rows of the matrix array.

5. The semiconductor device according to claim 4, further comprising a control section which in turn includes:
a sense amplifier configured to compare, upon reading operation, a voltage which varies in response to cell current of each of the thyristor elements and a reference voltage with each other and output read data corresponding to a result of the comparison; and
a write driver configured to drive, upon writing operation, the bit lines connected to said access transistors to a voltage corresponding to write data.

6. The semiconductor device according to claim 1, wherein
a plurality of memory cells including said memory cell are arrayed in a matrix, and
a plurality of bit lines including said bit lines are wired corresponding to the columns of the matrix array while a plurality of word lines including said word lines are wired corresponding to the rows of the matrix array.

7. The semiconductor device according to claim 6, further comprising a control section which in turn includes:
a sense amplifier configured to compare, upon reading operation, a voltage which varies in response to cell current of each of the thyristor elements and a reference voltage with each other and output read data corresponding to a result of the comparison; and
a write driver configured to drive, upon writing operation, the bit lines connected to said access transistors to a voltage corresponding to write data.

* * * * *